(12) United States Patent
Eguchi et al.

(10) Patent No.: US 8,957,423 B2
(45) Date of Patent: *Feb. 17, 2015

(54) SEMICONDUCTOR DEVICE

(71) Applicant: Semiconductor Energy Laboratory Co., Ltd., Kanagawa-ken (JP)

(72) Inventors: Shingo Eguchi, Tochigi (JP); Yoshiaki Oikawa, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/046,006

(22) Filed: Oct. 4, 2013

(65) Prior Publication Data

US 2014/0027852 A1 Jan. 30, 2014

Related U.S. Application Data

(63) Continuation of application No. 12/560,965, filed on Sep. 16, 2009, now Pat. No. 8,552,498.

(30) Foreign Application Priority Data

Sep. 19, 2008 (JP) .................................. 2008-240812

(51) Int. Cl.
*H01L 27/14* (2006.01)
*H01L 29/786* (2006.01)
(Continued)

(52) U.S. Cl.
CPC .............. *H01L 29/786* (2013.01); *H01L 27/12* (2013.01); *H01L 27/1214* (2013.01); *H01L 27/1266* (2013.01); *H01L 27/13* (2013.01)
USPC ....................... 257/72; 257/347; 257/E29.273

(58) Field of Classification Search
CPC . H01L 27/12; H01L 27/1214; H01L 27/1266; H01L 27/13
USPC ............... 257/59, 72, 679, 684, 247, E29.273
See application file for complete search history.

(56) References Cited

U.S. PATENT DOCUMENTS 5,075,166 A 12/1991 Sikorski et al.
5,597,631 A 1/1997 Furumoto et al.
(Continued)

FOREIGN PATENT DOCUMENTS

CN 1993829 7/2007
EP 0 939 441 A2 9/1999
(Continued)

OTHER PUBLICATIONS

International Search Report re application No. PCT/JP2009/065280, dated Dec. 1, 2009.
(Continued)

*Primary Examiner* — Jose R Diaz
(74) *Attorney, Agent, or Firm* — Husch Blackwell LLP

(57) ABSTRACT

A semiconductor device in which defects in characteristics due to electrostatic discharge is reduced and a method for manufacturing the semiconductor device are provided. The semiconductor device has at least one of these structures: (1) a structure in which a first and second insulating films are in direct contact with each other in a peripheral region of a circuit portion, (2) a structure in which a first and second insulators are closely attached to each other, and (3) a structure in which a first conductive layer and a second conductive layer are provided on outer surfaces of the first insulator and the second insulator, respectively, and electrical conduction between the first and second conductive layers is achieved at a side surface of the peripheral region. Note that the conduction at the side surface can be achieved by cutting a plurality of semiconductor devices into separate semiconductor devices.

9 Claims, 18 Drawing Sheets

(51) Int. Cl.
*H01L 27/12* (2006.01)
*H01L 27/13* (2006.01)

(56) References Cited

U.S. PATENT DOCUMENTS

| | | | |
|---|---|---|---|
| 5,757,456 A | 5/1998 | Yamazaki et al. | |
| 5,770,313 A | 6/1998 | Furumoto et al. | |
| 5,821,138 A | 10/1998 | Yamazaki et al. | |
| 5,879,502 A | 3/1999 | Gustafson | |
| 6,118,502 A | 9/2000 | Yamazaki et al. | |
| 6,127,199 A | 10/2000 | Inoue et al. | |
| 6,224,965 B1 | 5/2001 | Haas et al. | |
| 6,376,333 B1 | 4/2002 | Yamazaki et al. | |
| 6,399,903 B1 | 6/2002 | Stevenson | |
| 6,403,221 B1 | 6/2002 | Nakamura et al. | |
| 6,491,228 B1 | 12/2002 | Ueda et al. | |
| 6,509,217 B1 | 1/2003 | Reddy | |
| 6,762,508 B1 | 7/2004 | Kiso et al. | |
| 6,855,960 B2 * | 2/2005 | Park et al. | 257/98 |
| 6,909,114 B1 | 6/2005 | Yamazaki | |
| 6,998,282 B1 | 2/2006 | Yamazaki et al. | |
| 7,049,178 B2 | 5/2006 | Kim et al. | |
| 7,050,138 B1 | 5/2006 | Yamazaki et al. | |
| 7,061,083 B1 | 6/2006 | Usami et al. | |
| 7,132,984 B2 | 11/2006 | Kameda et al. | |
| 7,172,928 B2 | 2/2007 | Yamazaki | |
| 7,193,862 B2 | 3/2007 | Maekawa et al. | |
| 7,319,243 B2 * | 1/2008 | Kim | 257/98 |
| 7,361,519 B2 | 4/2008 | Yamazaki et al. | |
| 7,439,543 B2 | 10/2008 | Yamazaki | |
| 7,485,489 B2 | 2/2009 | Bjorbell | |
| 7,487,373 B2 | 2/2009 | Koyama | |
| 7,504,317 B2 | 3/2009 | Aoki et al. | |
| 7,510,950 B2 | 3/2009 | Tsurume et al. | |
| 7,511,420 B2 * | 3/2009 | Adachi et al. | 313/506 |
| 7,591,863 B2 | 9/2009 | Watanabe et al. | |
| 7,605,410 B2 | 10/2009 | Takano et al. | |
| 7,719,103 B2 | 5/2010 | Takahashi | |
| 7,791,153 B2 | 9/2010 | Tsurume et al. | |
| 7,888,163 B2 | 2/2011 | Chida et al. | |
| 7,906,847 B2 | 3/2011 | Ohtani et al. | |
| 8,103,897 B2 | 1/2012 | Endo et al. | |
| 8,123,896 B2 | 2/2012 | Watanabe et al. | |
| 8,552,498 B2 * | 10/2013 | Eguchi et al. | 257/347 |
| 8,642,987 B2 | 2/2014 | Takano et al. | |
| 2003/0032210 A1 | 2/2003 | Takayama et al. | |
| 2003/0071953 A1 | 4/2003 | Yamazaki et al. | |
| 2004/0016939 A1 | 1/2004 | Akiba et al. | |
| 2004/0229404 A1 | 11/2004 | Kiso et al. | |
| 2005/0070038 A1 | 3/2005 | Yamazaki et al. | |
| 2005/0085034 A1 | 4/2005 | Akiba et al. | |
| 2005/0104068 A1 | 5/2005 | Yamazaki | |
| 2005/0110016 A1 | 5/2005 | Yamazaki | |
| 2005/0162578 A1 | 7/2005 | Yamazaki et al. | |
| 2005/0233122 A1 | 10/2005 | Nishimura et al. | |
| 2005/0285231 A1 | 12/2005 | Arao et al. | |
| 2006/0011288 A1 | 1/2006 | Watanabe et al. | |
| 2006/0051906 A1 | 3/2006 | Yamazaki | |
| 2006/0273319 A1 | 12/2006 | Dairiki et al. | |
| 2007/0004125 A1 | 1/2007 | Watanabe et al. | |
| 2007/0044303 A1 | 3/2007 | Yamano | |
| 2007/0077691 A1 | 4/2007 | Watanabe | |
| 2007/0180285 A1 | 8/2007 | Dembo | |
| 2007/0181875 A1 | 8/2007 | Yamazaki et al. | |
| 2007/0259585 A1 | 11/2007 | Yamazaki et al. | |
| 2007/0278563 A1 | 12/2007 | Takano et al. | |
| 2008/0012126 A1 | 1/2008 | Dozen et al. | |
| 2008/0044940 A1 | 2/2008 | Watanabe et al. | |
| 2008/0054976 A1 | 3/2008 | Endo et al. | |
| 2008/0093464 A1 | 4/2008 | Dairiki et al. | |
| 2008/0179679 A1 | 7/2008 | Grudowski et al. | |
| 2008/0224940 A1 | 9/2008 | Sugiyama et al. | |
| 2008/0224941 A1 | 9/2008 | Sugiyama et al. | |
| 2008/0242005 A1 | 10/2008 | Dozen et al. | |
| 2008/0303140 A1 | 12/2008 | Ohtani et al. | |
| 2009/0057875 A1 | 3/2009 | Aoki et al. | |
| 2009/0065590 A1 | 3/2009 | Aoki et al. | |
| 2009/0065783 A1 * | 3/2009 | Moriwaki et al. | 257/72 |
| 2009/0085182 A1 | 4/2009 | Yamazaki et al. | |
| 2009/0212297 A1 | 8/2009 | Watanabe et al. | |
| 2009/0267225 A1 | 10/2009 | Eguchi | |
| 2009/0278252 A1 | 11/2009 | Oikawa et al. | |
| 2009/0289340 A1 | 11/2009 | Yamazaki et al. | |
| 2009/0289341 A1 | 11/2009 | Yamazaki et al. | |
| 2009/0302456 A1 | 12/2009 | Oikawa et al. | |
| 2009/0302457 A1 | 12/2009 | Chida et al. | |
| 2009/0305467 A1 | 12/2009 | Goto et al. | |
| 2009/0314527 A1 | 12/2009 | Hatano et al. | |

FOREIGN PATENT DOCUMENTS

| | | |
|---|---|---|
| EP | 1 003 223 A2 | 5/2000 |
| EP | 1 092 739 A1 | 4/2001 |
| EP | 1 589 797 A2 | 10/2005 |
| EP | 1 758 438 A2 | 2/2007 |
| EP | 1 818 860 A2 | 8/2007 |
| EP | 1 826 818 A2 | 8/2007 |
| EP | 1 970 951 A2 | 9/2008 |
| JP | 5-190582 A | 7/1993 |
| JP | 8-250745 A | 9/1996 |
| JP | 8-288522 A | 11/1996 |
| JP | 9-156265 A | 6/1997 |
| JP | 10-501475 | 2/1998 |
| JP | 10-92980 | 4/1998 |
| JP | 10-211784 A | 8/1998 |
| JP | 10-302027 A | 11/1998 |
| JP | 2000-231619 A | 8/2000 |
| JP | 2001-94113 | 4/2001 |
| JP | 2001-277726 A | 10/2001 |
| JP | 2003-141486 A | 5/2003 |
| JP | 2003-174153 A | 6/2003 |
| JP | 2004-94492 A | 3/2004 |
| JP | 2004-118255 A | 4/2004 |
| JP | 2004-362341 A | 12/2004 |
| JP | 2006-19717 | 1/2006 |
| JP | 2006-139802 A | 6/2006 |
| JP | 2007-043116 A | 2/2007 |
| JP | 2007-123859 A | 5/2007 |
| JP | 2007-234001 A | 9/2007 |
| JP | 2007-241999 | 9/2007 |
| JP | 2007-258689 A | 10/2007 |
| JP | 2007-264221 | 10/2007 |
| JP | 2008-84303 A | 4/2008 |
| WO | WO 95/33246 A1 | 12/1995 |
| WO | WO 96/09158 A1 | 3/1996 |
| WO | WO 01/01740 A1 | 1/2001 |
| WO | WO 2004/001848 A1 | 12/2003 |
| WO | WO 2005/119781 A1 | 12/2005 |
| WO | WO 2006/038438 A2 | 4/2006 |
| WO | WO 2007/043285 A1 | 4/2007 |
| WO | WO 2007/088796 A1 | 8/2007 |

OTHER PUBLICATIONS

Written Opinion re application No. PCT/JP2009/065280, dated Dec. 1, 2009.

Office Action re Chinese application No. CN 200980136494.3, dated Aug. 24, 2012.

Office Action re Japanese application No. JP 2009-208097, dated Jun. 4, 2013.

Office Action re Chinese application No. CN 200980136494.3, dated Aug. 24, 2012 (with English translation).

Office Action re Japanese application No. JP 2009-208097, dated Jun. 4, 2013 (with English translation).

* cited by examiner

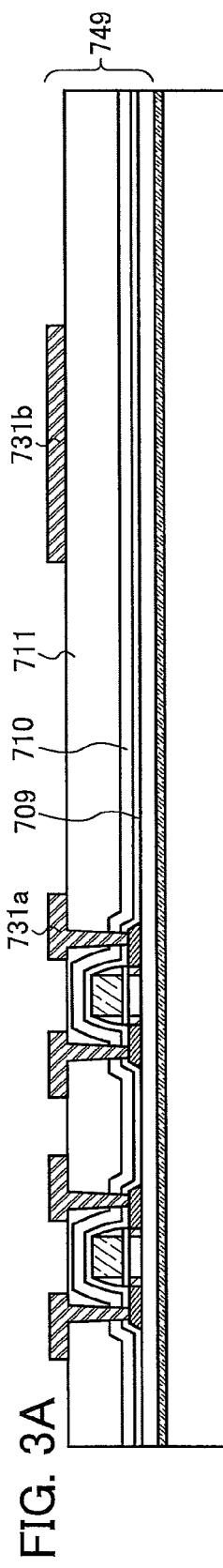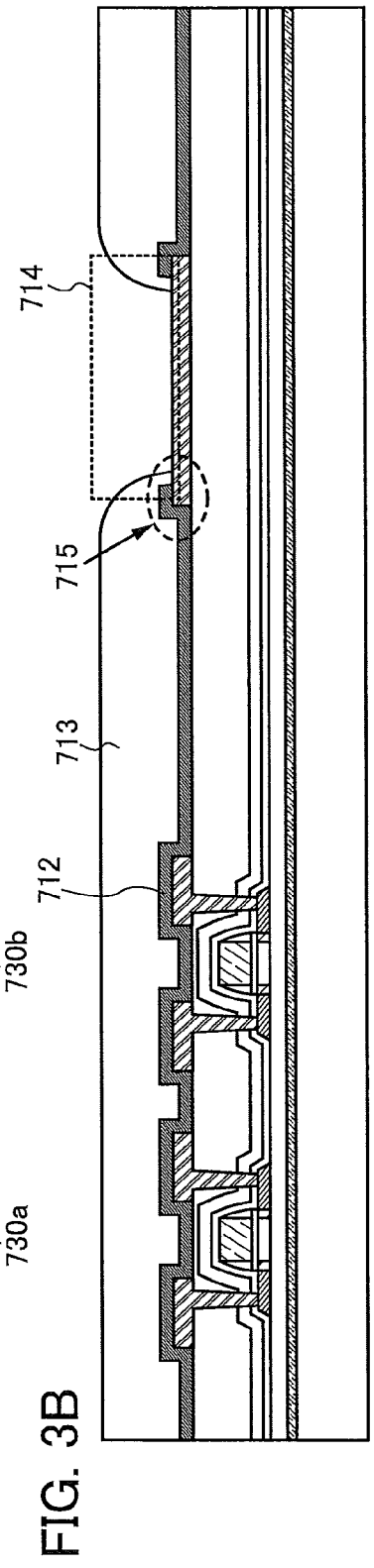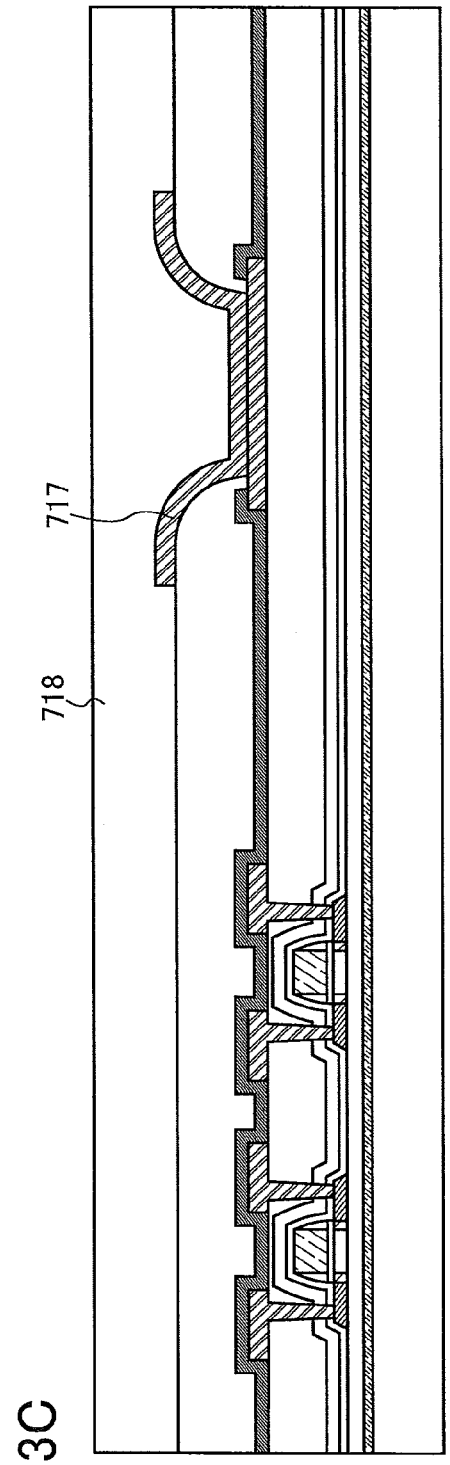

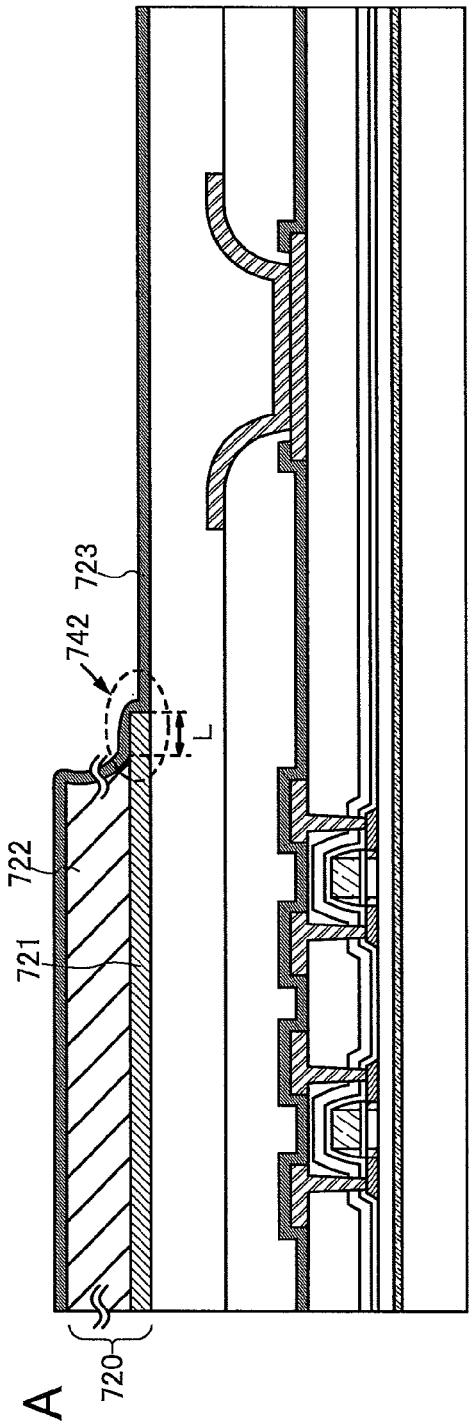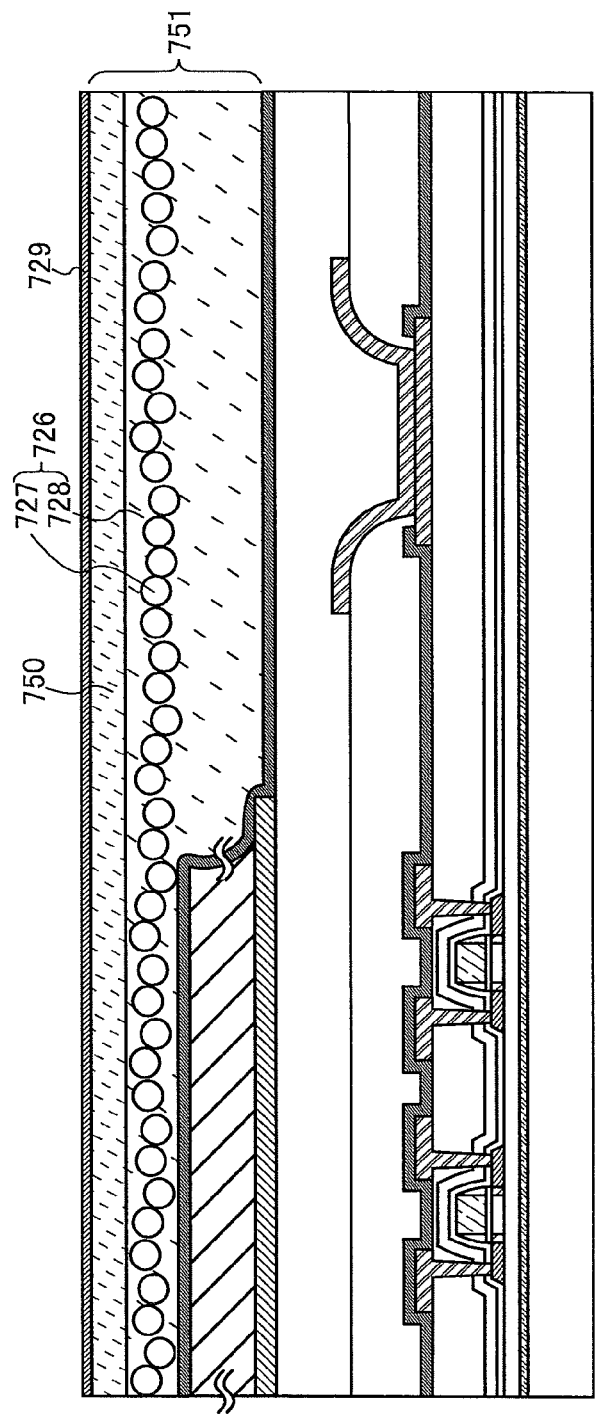
FIG. 4A
FIG. 4B

SEMICONDUCTOR DEVICE

This application is a continuation of copending U.S. application Ser. No. 12/560,965 filed on Sep. 16, 2009 which is incorporated herein by reference.

TECHNICAL FIELD

The present invention relates to semiconductor devices and methods for manufacturing the semiconductor devices.

BACKGROUND ART

In semiconductor devices transmitting and receiving data via wireless communication using an antenna (the semiconductor device is also referred to as a non-contact signal processing device, a semiconductor integrated circuit chip, an IC chip, or the like), there is a problem in that the semiconductor devices are broken by electrostatic discharge (electrostatic breakdown). Electrostatic breakdown is a serious problem which lowers reliability and productivity at every stage such as a manufacturing stage, a test stage, and a product use stage. Accordingly, measures against the problem have been investigated (for example, see Patent Document 1).

In Patent Document 1, electrostatic breakdown is prevented by using a conductive polymer as a substrate or an adhesive of a semiconductor device.

[Patent Document 1] Japanese Published Patent Application No. 2007-241999

DISCLOSURE OF INVENTION

As the market for the above semiconductor devices grows, the semiconductor devices need to have a wider variety of shapes and higher performance. Therefore, semiconductor devices having higher resistance against electrostatic breakdown and having various desired properties have been required.

In addition, semiconductor devices having sufficient characteristics need to be manufactured by a simpler method.

Thus, an object of one embodiment of the present invention is to provide a semiconductor device in which deterioration in characteristics due to electrostatic discharge or the like is reduced.

Additionally, another object of one embodiment of the present invention is to provide the semiconductor device by a simple method.

Additionally, another object of one embodiment of the present invention is to provide a highly reliable semiconductor device which has resistance against external stress.

Additionally, another object of one embodiment of the present invention is to provide a semiconductor device in which a change over time in shape and characteristics are reduced.

In one embodiment of the present invention, a first conductive layer and a second conductive layer are formed on the outermost surface of a semiconductor device in order to increase resistance against electrostatic breakdown. When cut into separate semiconductor devices is performed, a means for melting an insulator and a conductive layer (e.g., laser light irradiation) is used, whereby conduction between the conductive layers can be obtained.

Further, in one embodiment of the present invention, a first insulator and a second insulator are placed on opposite surfaces of the semiconductor device so that the semiconductor device has resistance against external stress. Those insulators can also serve as an adhesive in an attachment step in forming the semiconductor device. Additionally, by forming the first insulator and the second insulator, which serve as an adhesive, using the same material, a change over time in shape and characteristics can be reduced.

Further, in one embodiment of the present invention, an insulating film is provided over the circuit portion and an insulating film is provided over the antenna so that a change over time in shape and characteristics is further reduced. Those insulating films are in direct contact with each other in a peripheral region. Note that the peripheral region refers to a region around the circuit portion including a thin film transistor.

In other words, one embodiment of the present invention is a semiconductor device having at least one of these structures: (1) a structure in which a first insulating film over the circuit portion and a second insulating film over the antenna are in direct contact with each other in a peripheral region, (2) a structure in which the first insulating film over the circuit portion and the second insulating film over the antenna are removed in the peripheral region and the first insulator and the second insulator, which serve as an adhesive, are closely attached with each other in a region where the first insulating film and the second insulating film are removed, and (3) a structure in which a first conductive layer and a second conductive layer are provided on outer surfaces of the first insulator and the second insulator (the surfaces on which the circuit portion and the like are not provided), respectively, and conduction between the first and second conductive layers is achieved at a side surface of the peripheral region. It is needless to say that if all the above structures are provided, they can provide a synergy effect and thus the semiconductor device can have significantly higher reliability.

By the above cut by which conduction between the first conductive layer and the second conductive layer is achieved, the value of resistance between the first conductive layer and the second conductive layer is preferably 1 GΩ or lower.

In the above semiconductor device, each of the first and second insulators is preferably a structure body in which a fibrous body is impregnated with an organic resin.

In the above semiconductor device, each of the first and second insulating films is preferably a silicon nitride film. A silicon nitride film is denser than a silicon oxide film and the like and thus can efficiently prevent entry of moisture and oxygen.

Note that in this specification, semiconductor devices are devices which can function by utilizing semiconductor characteristics.

Effect of the Invention

By forming a conductive layer on a surface of a semiconductor device, electrostatic breakdown of a semiconductor integrated circuit (malfunction of the circuit, damage to semiconductor elements, and the like) can be prevented.

Further, by cutting semiconductor devices into separate devices by laser light irradiation, semiconductor devices having sufficient resistance against electrostatic breakdown can be obtained by an extremely simple method.

Further, by placing insulators on opposite surfaces of the semiconductor device, the semiconductor device can have resistance against external stress and thereby having higher reliability.

Further, a structure in which parts formed from the same material is closely attached to each other in an attachment step is employed, whereby a change over time in shape and characteristics of the semiconductor device can be reduced.

BRIEF DESCRIPTION OF DRAWINGS

FIGS. 3A to 3C illustrate a method for manufacturing a semiconductor device according to one embodiment of the present invention.

FIGS. 4A and 4B illustrate a method for manufacturing a semiconductor device according to one embodiment of the present invention.

BEST MODE FOR CARRYING OUT THE INVENTION

Figure 1A:
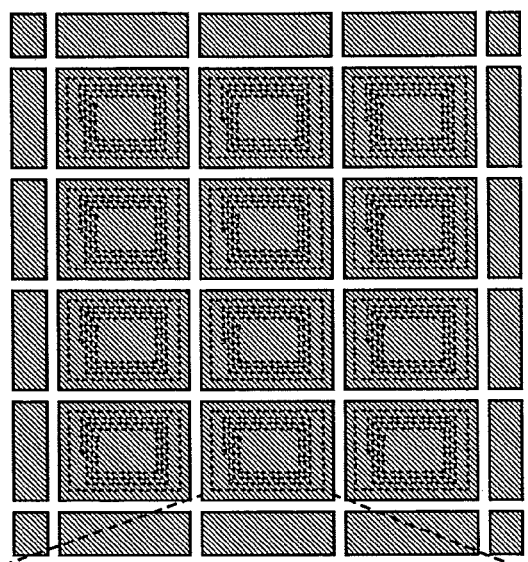
FIGS. 1A to 1C illustrate a semiconductor device according to one embodiment of the present invention.

Hereinafter, embodiments of the present invention will be described. However, the present invention can be implemented with various modes and it will be readily appreciated by those who skilled in the art that modes and details can be modified in various ways without departing from the spirit and the scope of the present invention. Accordingly, the present invention should not be construed as being limited to the description of the embodiments. Note that in a structure of the present invention described below, like portions or portions having like functions in the drawings are denoted by the like reference numerals and repeated description thereof is omitted.

(Embodiment 1)

In this embodiment, a structure of a semiconductor device will be described. The semiconductor device of this embodiment has a total thickness as small as 40 µm to 90 µm, preferably 70 µm to 80 µm and thus has flexibility.

FIG. 1A is a top view of a plurality of semiconductor devices which are formed at the same time over an insulating substrate. The semiconductor devices of this embodiment can be formed at the same time using a rectangular insulating substrate. Accordingly, the number of semiconductor devices which can be obtained with one substrate is increased compared with a case of using a circular silicon wafer, whereby cost can be reduced.

Figure 1B:
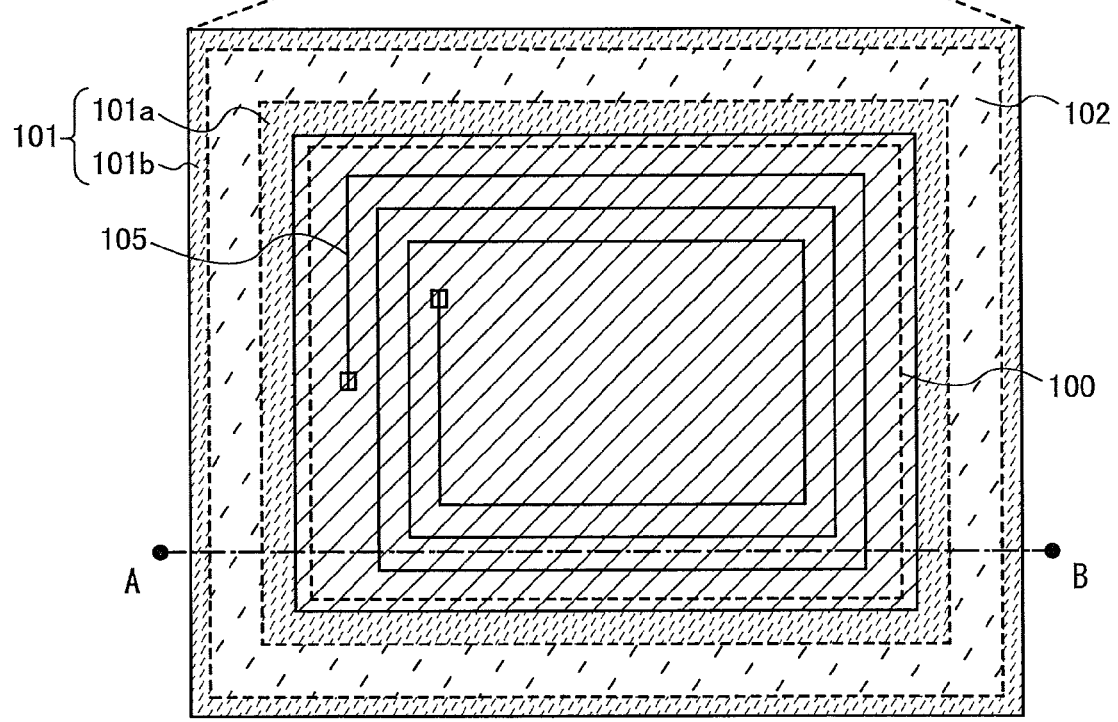
Figure 1C:
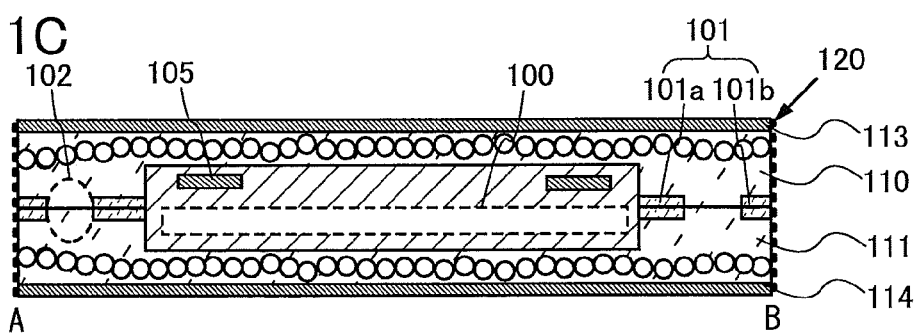

A plurality of semiconductor devices are cut with a cutting means into separate semiconductor devices. FIG. 1B illustrates one of the semiconductor devices. FIG. 1C is a cross-sectional view taken along line A-B of FIG. 1B.

The semiconductor device is provided with a circuit portion 100 and serves as a wireless chip and the like. The circuit portion 100 includes a thin film transistor formed over the insulating substrate. Such a thin film transistor has a smaller thickness than a transistor formed over a semiconductor substrate, and therefore can contribute to the flexibility of the semiconductor device. For wireless communication, a built-in antenna 105 which is electrically connected to the circuit portion 100 is provided. By providing the built-in antenna 105 over the thin film transistor in the circuit portion, higher level of integration and smaller size of the semiconductor device can be achieved, which is preferable. When the built-in antenna 105 is thus provided over the thin film transistor, the total thickness of the built-in antenna and the circuit portion 100 is 7 µm to 8 µm.

Around the circuit portion 100 is a region (which is referred to as a peripheral region) which is not provided with the above thin film transistor or the antenna. Further, the peripheral region has a region (which is referred to as an insulating film formation region) 101 (101a and 101b) provided with insulating films covering the thin film transistor and the antenna. The insulating film formation regions 101a and 101b can prevent entry of moisture and oxygen because the insulating films are in direct contact with each other. Further, the insulating films are preferably formed from the same material; for example, they can be silicon nitride films. A silicon nitride film is denser than a silicon oxide film and the like and thus can efficiently prevent entry of moisture and oxygen. Further, seen from above, the insulating film formation region 101 is provided to surround the circuit portion 100; therefore, entry of moisture and impurities, which may cause deterioration of the thin film transistor and the like, can be efficiently prevented. As a result, a change over time in characteristics of the semiconductor device, specifically, of the thin film transistor forming the circuit portion can be reduced. The insulating film formation regions 101a and 101b are thinner than the circuit portion 100 and have a thickness of 3 µm to 4 µm.

A part of the peripheral region (in this embodiment, a part near the center of the peripheral region) is a region (which is referred to as an attachment region) 102. In the region 102, the insulating films are removed and a first insulator 110 and a second insulator 111 which are provided over and under the circuit portion 100 and serve as an adhesive are closely attached to each other. The insulating film formation regions may be in a plurality of regions depending on the positions and the number of regions serving as the attachment region 102. In this embodiment, an example is described in which one attachment region 102 is provided near the center of the peripheral region; therefore, two insulating film formation regions (101a and 101b) are provided. Apparently, two attachment regions 102 may be provided as selected in the peripheral region. In that case, three insulating film formation regions are provided. Two or more attachment regions may be formed in the peripheral region. In the attachment region 102, the first insulator and the second insulator, which are provided on opposite surfaces of the semiconductor device, are closely attached. When the first insulator and the second insulator are formed from the same material, the adhesion is improved, which is preferable and can lead to a reduction in change over time in shape and characteristics of the semiconductor device.

Outer surfaces of the first insulator 110 and the second insulator 111 (the surface on which the circuit portion and the like is not provided), which serve as an adhesive, are covered with a first conductive layer 113 and a second conductive layer 114, respectively. With the conductive layers, breakdown of the semiconductor device due to static electricity can be prevented. This is because when static electricity is generated, high voltage will be locally applied to the semiconductor device, but the conductive layers on the opposite surfaces which have lower resistance than the insulators can dissipate the high voltage. As a result, resistance against electrostatic breakdown of the semiconductor device can be improved.

The semiconductor device terminates outside the peripheral region. At a side surface of the peripheral region, that is, a termination portion 120 of the semiconductor device, the first conductive layer 113 and the second conductive layer 114 can be electrically conducted with each other. As a result, static electricity can be dissipated into a larger area, whereby breakdown due to static electricity can be efficiently prevented. Electrical conduction between the first conductive layer 113 and the second conductive layer 114 is not exclusively achieved with a film-shaped conductive layer. The electrical conduction can be made only by dispersion and attachment of a material of the first conductive layer 113 or the second conductive layer 114 to the termination portion 120 when the semiconductor device is cut. This is because since the insulators serving as an adhesive have high resistance, when a part of the material of the conductive layer is only attached to the termination portion, as described above, the resistance of the termination portion 120 is lowered, whereby electrical conduction between the first conductive layer 113 and the second conductive layer 114 is substantially made. If the value of resistance between the first conductive layer and the second conductive layer is approximately 1 GΩ or lower (at 10 V), static electricity can be sufficiently dissipated; therefore, measures against static electricity may be taken depending on that value.

In such a semiconductor device, breakdown of the circuit portion due to static electricity can be prevented by the conductive layers provided on the outermost surfaces. Further, since the parts formed from the same material are closely attached to each other, the adhesion is high and deterioration due to moisture and the like and peeling at an unintended part can be prevented. Thus, the semiconductor device of this embodiment has few defects and high reliability.
(Embodiment 2)

In this embodiment, an example of a method for manufacturing a semiconductor device described in the above embodiment is described.

Figure 2A:
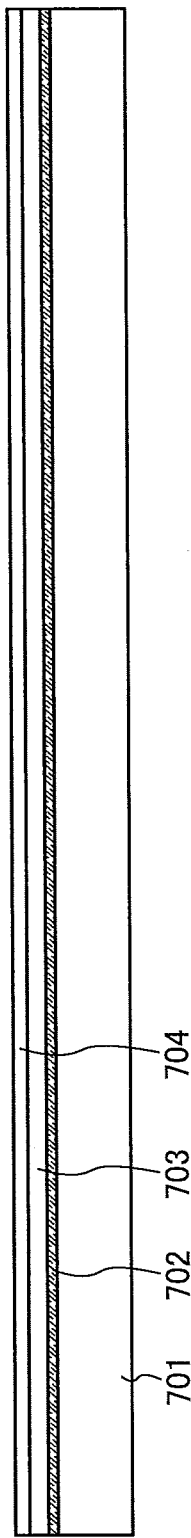
FIGS. 2A to 2C illustrate a method for manufacturing a semiconductor device according to one embodiment of the present invention.

First, a separation layer 702 is formed on a surface of a substrate 701, and an insulating film 703 serving as a base and a semiconductor film 704 (e.g., a film containing amorphous silicon) are formed (see FIG. 2A). The separation layer 702, the insulating film 703, and the semiconductor film 704 can be formed successively, which can prevent impurities from entering because the films are not exposed to the atmosphere.

As the substrate 701, a glass substrate, a quartz substrate, a metal substrate, a stainless steel substrate, a plastic substrate having heat resistance to the processing temperature of this process, or the like may be used. Such a substrate is not particularly limited in area or shape. For example, by using a rectangular substrate with a side of 1 meter or longer, productivity can be significantly increased. This is a great advantage as compared to the case of using a circular silicon substrate. Even when a circuit portion occupies a larger area, production cost can be reduced as compared to the case of using the silicon substrate.

Note that the separation layer 702 is formed over the entire surface of the substrate 701 in this process; however, a separation layer may be formed over the entire surface of the substrate 701 and then selectively provided by a photolithography method as needed to form the separation layer 702. In addition, although the separation layer 702 is formed in contact with the substrate 701 in this process, an insulating film such as a silicon oxide film, a silicon oxynitride film, a silicon nitride film, or a silicon nitride oxide film may be formed in contact with the substrate 701 as needed, and the separation layer 702 may be formed in contact with the insulating film.

Here, oxynitride refers to a substance that contains more oxygen than nitrogen, and nitride oxide refers to a substance that contains more nitrogen than oxygen. For example, silicon oxynitride is a substance containing oxygen, nitrogen, silicon, and hydrogen at concentrations ranging from 50 atomic % to 70 atomic %, inclusive, 0.5 atomic % to 15 atomic %, inclusive, 25 atomic % to 35 atomic %, inclusive, and 0.1 atomic % to 10 atomic %, inclusive, respectively. Furthermore, silicon nitride oxide is a substance containing oxygen, nitrogen, silicon, and hydrogen at concentrations ranging from 5 atomic % to 30 atomic %, inclusive, 20 atomic % to 55 atomic %, inclusive, 25 atomic % to 35 atomic %, inclusive, and 10 atomic % to 30 atomic %, inclusive, respectively. Note that the above concentration ranges are obtained when measurements are performed using rutherford backscattering spectrometry (RBS) or hydrogen forward scattering (HFS). In addition, the total of the percentages of the constituent elements does not exceed 100 atomic %.

As the separation layer 702, a metal film, a stacked-layer structure of a metal film and a metal oxide film, or the like can be used. The metal film has a single-layer structure or a stacked-layer structure of a film made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir); an alloy material containing any of the above elements as its main component; or a compound material containing any of the above elements as its main component. A film formed from any of those materials can be formed by a sputtering method or any of a variety of CVD methods such as a plasma CVD method. As the a stacked-layer structure of a metal film and a metal oxide film, after the above metal film is formed, oxide or oxynitride of the metal film can be formed on the surface of the metal film by performing plasma treatment in an oxygen atmosphere or an $N_2O$ atmosphere, or heat treatment in an oxygen atmosphere or an $N_2O$ atmosphere. Alternatively, after the metal film is formed, the surface of the metal film may be subjected to treatment with a highly oxidizing solution such as ozone water, whereby oxide or oxynitride of the metal film can be provided on the surface of the metal film.

The insulating film 703 has a single-layer structure or a stacked-layer structure of a film containing oxide of silicon or nitride of silicon formed by a sputtering method, a plasma CVD method, or the like. If the insulating film 703 serving as a base has a two-layer structure, for example, a silicon nitride oxide film may be formed as a first layer and a silicon oxynitride film may be formed as a second layer. If the insulating film 703 serving as a base has a three-layer structure, a silicon oxide film, a silicon nitride oxide film, and a silicon oxynitride film may be formed as a first layer, a second layer, and a third layer, respectively. Alternatively, a silicon oxynitride film, a silicon nitride oxide film, and a silicon oxynitride film may be formed as a first layer, a second layer, and a third layer, respectively. The insulating film 703 serving as a base serves as a blocking film to prevent impurities from entering from the substrate 701.

The semiconductor film 704 is formed by a sputtering method, an LPCVD method, a plasma CVD method, or the like to a thickness of approximately 25 nm to 200 nm, inclusive, preferably approximately 50 nm to 70 nm, inclusive. Specifically, the thickness of the semiconductor film 704 is 66 nm in this embodiment. As the semiconductor film 704, for example, an amorphous silicon film may be formed.

Figure 2B:
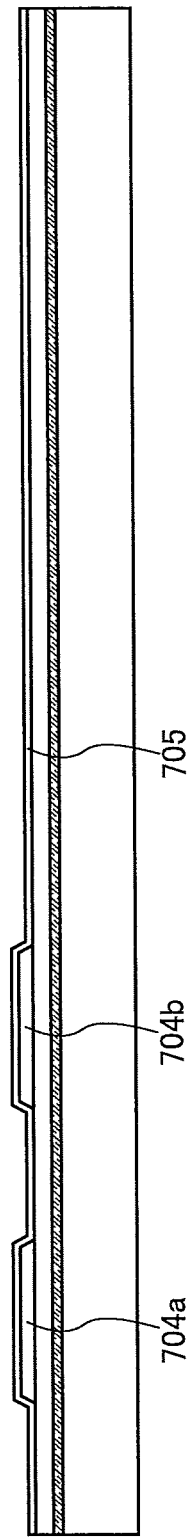

Next, the semiconductor film 704 is irradiated with laser light to be crystallized. Note that the semiconductor film 704 may be crystallized, for example, by combining rapid thermal annealing (RTA), a thermal crystallization method using an annealing furnace, or a thermal crystallization method using a metal element that promotes crystallization, with laser light irradiation. After that, the obtained crystal semiconductor film is etched into a desired shape; whereby a semiconductor film 704a and a semiconductor film 704b are formed. Then, a gate insulating film 705 is formed to cover the semiconductor films 704a and 704b (see FIG. 2B).

An example of a manufacturing step of the semiconductor films 704a and 704b will be briefly described below. First, an amorphous semiconductor film (e.g., an amorphous silicon film) is formed by a plasma CVD method. Then, a solution containing nickel that is a metal element promoting crystallization is applied over the amorphous semiconductor film, and then the amorphous semiconductor film is subjected to dehydrogenation treatment (at 500° C. for one hour) and thermal crystallization treatment (at 550° C. for four hours), whereby a crystal semiconductor film is formed. Then, the crystal semiconductor film is irradiated with laser light from a laser as needed, depending on the degree of crystallization. Further, the semiconductor films 704a and 704b are formed by a photolithography method. Note that the thermal crystallization using a metal element that promotes crystallization is not necessarily performed and the amorphous semiconductor film may be crystallized only by laser light irradiation.

Alternatively, the semiconductor film may be irradiated with continuous wave laser light or laser light oscillated at a repetition rate of 10 MHz or greater and scanned in one direction for crystallization, whereby the semiconductor films 704a and 704b which are thus crystallized can be obtained. In the case of such crystallization, crystals grow in the laser light scanning direction. A thin film transistor may be provided so that its channel length direction (the direction in which carriers flow when a channel formation region is formed) is aligned with the scanning direction.

Next, the gate insulating film 705 is formed to cover the semiconductor films 704a and 704b. The gate insulating film 705 has a single-layer structure or a stacked-layer structure of a film containing oxide of silicon or nitride of silicon formed by a CVD method, a sputtering method, or the like. Specifically, the gate insulating film 705 has a single-layer structure or a stacked-layer structure of a silicon oxide film, a silicon oxynitride film, or a silicon nitride oxide film.

Alternatively, the gate insulating film 705 may be formed by oxidizing or nitriding the surfaces of the semiconductor films 704a and 704b by plasma treatment. For example, the gate insulating film 705 is formed by plasma treatment with a mixed gas of a rare gas such as He, Ar, Kr or Xe and oxygen, nitrogen oxide ($NO_2$), ammonia, nitrogen, hydrogen, or the like. In that case, plasma is excited by microwaves, so that plasma with a low electron temperature and a high density can be generated. The surfaces of the semiconductor films can be oxidized or nitrided by oxygen radicals (that may include OH radicals) or nitrogen radicals (that may include NH radicals), which are generated by the high-density plasma.

By treatment with such high-density plasma, an insulating film having a thickness of approximately 1 nm to 20 nm, inclusive, typically approximately 5 nm to 10 nm, inclusive, is formed over the semiconductor films. Since the reaction in that case is a solid-phase reaction, the interface state density between the insulating film and the semiconductor films can be significantly decreased. The semiconductor films (crystalline silicon or polycrystalline silicon) are directly oxidized (or nitrided) by such plasma treatment, whereby variation in thickness of the fouled insulating film can be considerably reduced. In addition, oxidation does not proceed at the crystal grain boundaries of crystalline silicon, which makes a very preferable condition. That is, by the solid-phase oxidation of the surfaces of the semiconductor films with the high-density plasma treatment described here, an insulating film with good uniformity and low-interface state density can be formed without excessive oxidation reaction at crystal grain boundaries.

As the gate insulating film 705, only an insulating film formed by the plasma treatment may be used or an insulating film made of silicon oxide, silicon oxynitride, or silicon nitride may be additionally deposited thereover to be stacked by a CVD method using plasma or thermal reaction. In any case, if an insulating film formed by the plasma treatment are included in a part or the whole of gate insulating films of thin film transistors, variation in characteristics of the thin film transistors can be reduced, which is preferable.

Further, in the case where the semiconductor films 704a and 704b are formed in a manner that a semiconductor film is irradiated with continuous wave laser light or laser light oscillated at a repetition rate of 10 MHz or greater and is scanned in one direction for crystallization, by combining the gate insulating film on which the above plasma treatment is performed and the semiconductor films 704a and 704b, thin film transistors (TFTs) with high field effect mobility and small variation in characteristics can be obtained.

Next, a conductive film is formed over the gate insulating film 705. Here, a single conductive film with a thickness of approximately 100 nm to 500 nm, inclusive, is formed. Examples of a material which can be used for the conductive film include a material containing an element selected from tantalum (Ta), tungsten (W), titanium (Ti), molybdenum (Mo), aluminum (Al), copper (Cu), chromium (Cr), niobium (Nb), and the like; an alloy material containing any of the above elements as its main component; or a compound material containing any of the above elements as its main component. Alternatively, a semiconductor material typified by polycrystalline silicon doped with an impurity element such as phosphorus may be used. In the case where the conductive film has a stacked-layer structure, for example, it is possible to use a stacked-layer structure of a tantalum nitride film and a tungsten film, a stacked-layer structure of a tungsten nitride film and a tungsten film, or a stacked-layer structure of a molybdenum nitride film and a molybdenum film. For example, a stacked-layer structure of a tantalum nitride film having a thickness of 30 nm and a tungsten film having a thickness of 150 nm can be used. Since tungsten and tantalum nitride have high heat resistance, heat treatment for thermal activation can be performed after the conductive film is formed. Alternatively, the conductive film may have a stacked-layer structure of three or more layers, and for example, a stacked-layer structure of a molybdenum film, an aluminum film, and a molybdenum film can be employed.

Next, a resist mask is formed over the above conductive film by a photolithography method and etching treatment is performed for forming a gate electrode and a gate wiring, whereby gate electrodes 707 are formed over the semiconductor films 704a and 704b.

Then, a mask formed of resist is formed by a photolithography method and an impurity element imparting n-type or p-type conductivity is added to the semiconductor films 704a and 704b at a low concentration by an ion doping method or an ion implantation method. In this embodiment, an impurity element imparting n-type conductivity is added to the semiconductor films 704a and 704b at a low concentration. As the impurity element imparting n-type conductivity, an element belonging to Group 15 of the periodic table, for example, phosphorus (P) or arsenic (As) can be used. As an impurity element imparting p-type conductivity, an element belonging to Group 13 of the periodic table, for example, boron (B) can be used.

Although only thin film transistors including a semiconductor film to which an impurity element imparting n-type conductivity is added (n-type TFTs) are described in this embodiment for clarity, the present invention is not limited to this structure. Only thin film transistors including a semiconductor film to which an impurity element imparting p-type conductivity is added (p-type TFTs) may be used. Alternatively, n-type TFTs and p-type TFTs may be formed in combination. In the case where n-type TFTs and p-type TFTs are formed in combination, an impurity element imparting n-type conductivity is added using a mask covering semiconductor layers that are to be included in the p-type TFTs, and then an impurity element imparting p-type conductivity is added using a mask covering semiconductor layers that are to be included in the n-type TFTs, whereby the impurity element imparting n-type conductivity and the impurity element imparting p-type conductivity can be added as selected.

Next, an insulating film is formed to cover the gate insulating film 705 and the gate electrodes 707. The formed insulating film and the gate insulating film 705 have a single-layer structure or a stacked-layer structure of a film containing an inorganic material such as silicon, oxide of silicon, or nitride of silicon, or a film containing an organic material such as an organic resin, which is formed by a CVD method, a sputtering method, or the like. Then, the insulating film is selectively etched by anisotropic etching performed mainly in a perpendicular direction, whereby insulating films 708 (also referred to as sidewalls) touching the side surfaces of the gate electrodes 707 are formed. The insulating films 708 are used as masks when an impurity element is added later for forming lightly doped drain (LDD) regions.

Figure 2C:
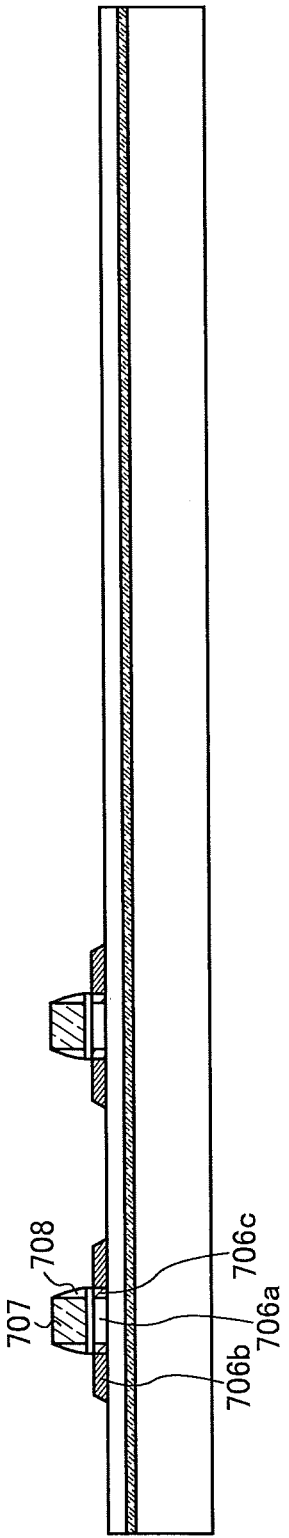

Next, an impurity element imparting n-type conductivity is added to the semiconductor films 704a and 704b using the gate electrodes 707 and the insulating films 708 as a mask. Thus, a channel formation region 706a, first impurity regions 706b, and second impurity regions 706c are formed (see FIG. 2C). The first impurity regions 706b serve as a source and drain regions of a thin film transistor, and the second impurity regions 706c serve as LDD regions. The concentration of the impurity element contained in the second impurity regions 706c is lower than that of the impurity element contained in the first impurity regions 706b.

Then, an insulating film having a single-layer structure or a stacked-layer structure is formed to cover the gate electrodes 707, the insulating films 708, and the like. In this embodiment, an example is described in which the insulating film has a three-layer structure of insulating films 709, 710, and 711. These insulating films can be formed by a CVD method. For example, a silicon oxynitride film having a thickness of 50 nm, a silicon nitride oxide film having a thickness of 200 nm, and a silicon oxynitride film having a thickness of 400 nm can be formed as the insulating film 709, the insulating film 710, and the insulating film 711, respectively. Surfaces of these insulating films are, although depending on the thicknesses, formed along the surface of the layer provided therebelow. In other words, since the insulating film 709 has a small thickness, the surface of the insulating film 709 closely corresponds to the surfaces of the gate electrodes 707. As the thickness of the film is larger, its surface becomes planar; therefore, the surface of the insulating film 711 whose thickness is the largest of the three films is almost planar. However, the insulating film 711 is not formed using an organic material; therefore, the surface of the insulating film 711 is not exactly planar. That is, if it is desired that the surface of the insulating film 711 be planar, an organic material such as polyimide, polyamide, benzocyclobutene, acrylic, or epoxy; a siloxane material; or the like may be used. Further, as a formation method of these insulating films, a sputtering method, an SOG method, a droplet discharge method, a screen printing method, or the like can be employed in addition to a CVD method.

Then, the insulating films 709, 710, and 711, and the like are etched using a photolithography method to form contact holes reaching the first impurity regions 706b. Then, conductive films 731a serving as source and drain electrodes of the thin film transistors and a conductive film 731b serving as a connecting wiring are formed. The conductive films 731a and the conductive film 731b can be formed in such a manner: a conductive film is formed so as to fill the contact holes and then the conductive film is selectively etched. Note that before the conductive film is formed, a silicide may be formed over the surfaces of the semiconductor films 704a and 704b that are exposed by the contact holes to reduce resistance. The conductive films 731a and the conductive film 731b are preferably formed using a low resistance material in order to reduce signal delay. Since a low resistance material often has low heat resistance, a high heat resistance material is preferably provided over and below the low resistance material. For example, a structure is preferable in which a film of aluminum, which is a low resistance material, is formed with a thickness of 300 nm and a film of titanium with a thickness of 100 nm is formed over and below the aluminum film. Further, when the conductive film 731b, which serves as a connecting wiring, is formed to have the same stacked-layer structure as the conductive films 731a, resistance of the connecting wiring can be lowered and heat resistance of the connecting wiring can be improved. The conductive films 731a and the conductive film 731b can be formed to have a single-layer structure or a stacked-layer structure using another conductive material, for example: a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive films 731a and the conductive film 731b can be formed by a CVD method, a sputtering method, or the like.

Accordingly, an element layer 749 including a thin film transistor 730a and a thin film transistor 730b can be obtained (see FIG. 3A).

Note that heat treatment for repairing crystallinity of the semiconductor film 704, activating the impurity element which is added to the semiconductor film 704, and hydrogenating the semiconductor film 704 may be performed before the insulating films 709, 710, and 711 are formed; after the insulating film 709 is formed; or after the insulating films 709 and 710 are formed. For the heat treatment, a thermal annealing method, a laser annealing method, an RTA method, or the like may be employed.

Next, insulating films 712 and 713 are formed so as to cover the conductive films 731a and the conductive film 731b (see FIG. 3B). The case where a silicon nitride film having a thickness of 100 nm is used for the insulating film 712 and a polyimide film having a thickness of 1500 nm is used for the insulating film 713 is described as an example. It is preferable that a surface of the insulating film 713 have high planarity. Therefore, the planarity of the insulating film 713 is improved by making the film have a large thickness of, for example, 750 nm to 3000 nm, inclusive, (specifically, 1500 nm) in addition to the characteristics of polyimide, which is an organic material. An opening portion is formed in the insulating films 712 and 713. In this embodiment, the case where an opening 714 exposing the conductive film 731b is formed is described as an example. In the opening 714 (specifically, in a region 715 surrounded by a dotted line), an end portion of the insulating film 712 is covered with the insulating film 713. By covering the end portion of the lower insulating film 712 with the upper insulating film 713, disconnection of a wiring to be formed later in the opening 714 can be prevented. In this embodiment, since the insulating film 713 is formed using polyimide, which is an organic material, the insulating film 713 can have a gently tapered shape in the opening 714, and disconnection can be efficiently prevented. As a material for the insulating film 713 with which such an effect of preventing disconnection can be obtained, an organic material such as polyamide, benzocyclobutene, acrylic, or epoxy; a siloxane material; or the like can be given in addition to polyimide. Further, as the insulating film 712, a silicon oxynitride film or a silicon nitride oxide film may be used instead of the silicon nitride film. As a formation method of the insulating films 712 and 713, a CVD method, a sputtering method, an SOG method, a droplet discharge method, a screen printing method, or the like can be used.

Next, a conductive film 717 is formed over the insulating film 713, and an insulating film 718 is formed over the conductive film 717 (see FIG. 3C). The conductive film 717 can be formed using the same material as the conductive films 731a and the conductive film 731b, and for example, a stacked-layer structure of a titanium film having a thickness of 100 nm, an aluminum film having a thickness of 200 nm, and a titanium film having a thickness of 100 nm can be employed. Since the conductive film 717 is connected to the conductive film 731b in the opening 714, the films formed using titanium are in contact with each other, whereby contact resistance can be suppressed. In addition, since a current based on a signal between the thin film transistor and an antenna (formed later) flows in the conductive film 717, wiring resistance of the conductive film 717 is preferably low. Therefore, a low resistance material such as aluminum is preferably used. The conductive film 717 can be formed to have a single-layer structure or a stacked-layer structure, using another conductive material, for example, a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive film 717 can be formed by a CVD method, a sputtering method, or the like. The insulating film 718 should have a planar surface and therefore is preferably formed from an organic material. Here, the case where a polyimide film having a thickness of 2000 nm is used for the insulating film 718 is described as an example. The insulating film 718 is formed to have a thickness of 2000 nm, which is larger than the thickness of the insulating film 713, because projections and depressions formed by the surfaces of the opening 714 of the insulating film 713 having a thickness of 1500 nm and the conductive film 717 formed in the opening 714 should be planarized. Therefore, the insulating film 718 preferably has a thickness 1.1 to 2 times, preferably, 1.2 to 1.5 times the thickness of the insulating film 713. When the insulating film 713 has a thickness of 750 nm to 3000 nm, inclusive, the insulating film 718 preferably has a thickness 900 nm to 4500 nm, inclusive. The insulating film 718 is preferably formed using a material with which planarity can be improved in consideration of the thickness of the insulating film 718. As a material for the insulating film 718 with which the planarity can be improved, an organic material such as polyamide, benzocyclobutene, acrylic, or epoxy; a siloxane material; or the like can be given in addition to polyimide. In the case where an antenna is formed over the insulating film 718, as described above, the planarity of the surface of the insulating film 718 should be taken into consideration.

Figure 7:
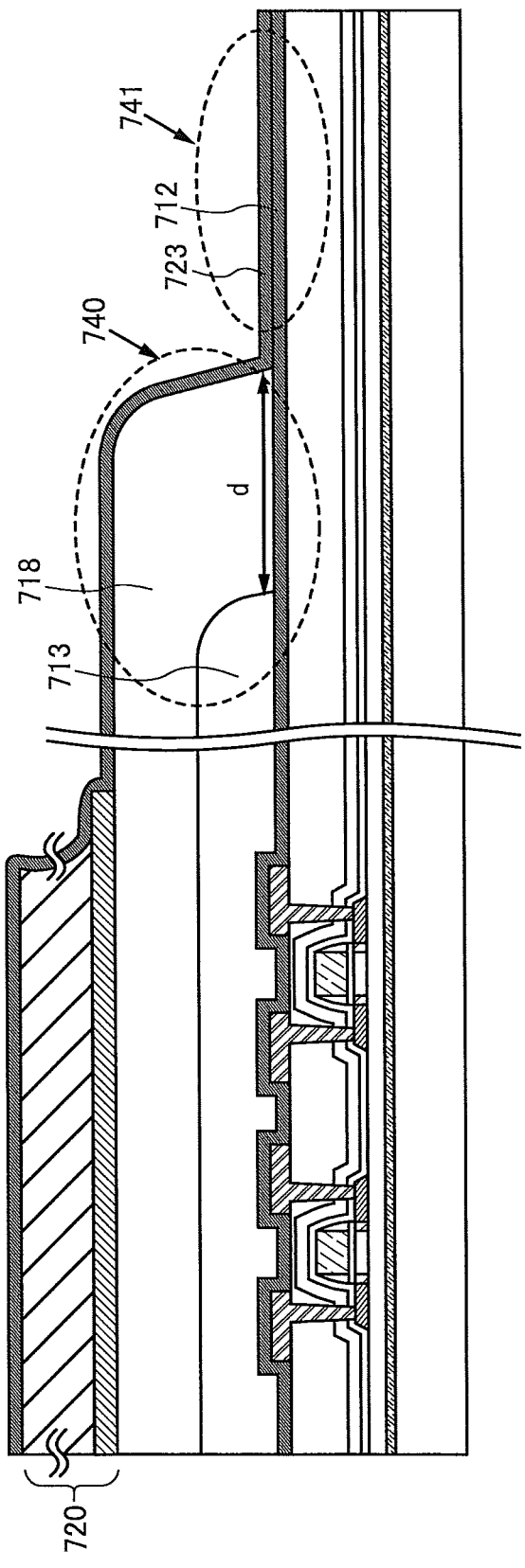
FIG. 7 illustrates a method for manufacturing a semiconductor device according to one embodiment of the present invention.

FIG. 7 illustrates the peripheral region of the circuit portion. Further, in the circuit portion, the insulating film 718 preferably covers an end portion of the insulating film 713 outside the antenna (specifically, in a region 740). When the insulating film 718 covers the insulating film 713, it is preferable that the end of the insulating film 718 is located away from the end of the insulating film 713 by a distance (a distance d) two or more times as large as the total thickness of the insulating film 713 and the insulating film 718. In this embodiment, since the insulating film 713 is formed to have a thickness of 1500 nm and the insulating film 718 is formed to have a thickness of 2000 nm, the end of the insulating film 718, which covers the end portion of the insulating film 713, is away by a distance d of 7000 nm from the end of the insulating film 713. With such a structure, a margin of a process can be ensured, and further, that entry of moisture and oxygen can be prevented.

Next, an antenna 720 is formed over the insulating film 718 (see FIG. 4A). Then, the antenna 720 and the conductive film 717 are connected to each other through an opening (not shown). The opening is provided below the antenna 720 to improve the degree of integration. Note that although the antenna 720 may be directly connected to the conductive films 731a, provision of the conductive film 717 as in this embodiment is preferable because a margin can be secured for formation of the opening for connection with the antenna 720, and high integration can be achieved. Therefore, a conductive film may be further provided over the conductive film 717 to be connected to the antenna 720. That is, the antenna 720 may be electrically connected to the conductive films 731a included in the thin film transistors, and high integration can be achieved with a connection structure through a plurality of conductive films. When the thicknesses of the plurality of conductive films such as the conductive film 717 are large, the semiconductor device is also thickened; therefore, the thicknesses of the plurality of conductive films are preferably small. Therefore, the thickness of the conductive film 717 or the like is preferably smaller than that of the conductive films 731a.

The antenna 720 can employ a stacked-layer structure of a first conductive film 721 and a second conductive film 722. In this embodiment, the case where a stacked-layer structure is formed by employing a titanium film having a thickness of 100 nm and an aluminum film having a thickness of 5000 nm as the first conductive film 721 and the second conductive film 722, respectively, is described. Titanium can increase moisture resistance of the antenna, and can increase adhesion between the insulating film 718 and the antenna 720. In addition, by using titanium for the first conductive film 721, contact resistance between the first conductive film 721 and the conductive film 717 can be reduced. This is because, since the titanium film is formed as the uppermost layer of the conductive film 717, the conductive film 717 and the first conductive film 721, which are in contact with each other, are both formed from titanium. A titanium film which is employed as the first conductive film 721 is formed by dry etching, so an end portion thereof tends to have a steep angle. Aluminum which is used for the second conductive film 722 is a low resistance material, so it is suitable for the antenna. By forming the second conductive film 722 thickly, resistance can be further lowered. Resistance of the antenna is preferably lowered because a communication distance can be increased. An aluminum film which is employed as the second conductive film 722 is formed by wet etching, so a side surface of the end portion tends to have a tapered shape. The tapered shape in this embodiment is a shape the side surface of which curves toward the inside of the second conductive film 722, that is, a shape having a curved recessed side surface. Further, when the second conductive film 722 is wet etched, an end portion of the second conductive film 722 is inside the end portion of the first conductive film 721 (a region 742). For example, it is preferable that the end portion of the second conductive film 722 be inside the first conductive film 721 and the distance between the ends of the second conductive film 722 and the first conductive film 721 be a distance (a distance L) one-sixth to one-half the thickness of the second conductive film 722. In this embodiment, the end of the second conductive film 722 may be provided inside the end of the first conductive film 721 and the distance therebetween may be the distance L of 0.8 μm to 2 μm, inclusive. Since the end portion of the first conductive film 721 is projected from the end portion of the second conductive film 722, disconnection of an insulating film which is formed later can be prevented, and further, the durability of the antenna can be increased.

The antenna can be formed using, as a conductive material, a material containing a metal element such as silver, copper, gold, platinum, nickel, palladium, tantalum, or molybdenum; an alloy material containing any of these metal elements; or a compound material containing any of these metal elements, in addition to aluminum and titanium. As the formation method of the antenna, a CVD method, a sputtering method, a printing method such as screen printing or gravure printing, a droplet discharge method, a dispenser method, a plating method, or the like can be given. Although a stacked-layer structure is described as an example in this embodiment, a single-layer structure of any of the above materials may be employed.

An insulating film 723 is formed so as to cover the antenna 720. In this embodiment, the insulating film 723 is formed using a silicon nitride film having a thickness of 200 nm. The insulating film 723 is preferably provided because moisture resistance of the antenna can be further increased. Since the end portion of the titanium film is projected from the end portion of the aluminum film, the insulating film 723 can be formed without disconnection. The insulating film 723 as described above can be formed using a silicon oxynitride film, a silicon nitride oxide film, or another inorganic material in addition to the silicon nitride film.

Additionally, as illustrated in FIG. 7, the insulating film 723 and the insulating film 712 are preferably in direct contact with each other outside the insulating film 718, that is, outside the antenna in the circuit portion (specifically, a region 741 in FIG. 7). In this embodiment, both of the insulating films 712 and 723 are silicon nitride films Since the parts formed from the same material are directly attached to each other, the adhesion is high and entry of moisture and oxygen can be efficiently prevented. Further, a silicon nitride film is denser than a silicon oxide film and thus can effectively prevent entry of moisture and oxygen. The region in which the insulating films 712 and 723 are closely attached is in the peripheral region, which is not provided with the antenna or the thin film transistor, and therefore, has a very small thickness of 3 μm to 4 μm, inclusive. The peripheral region is formed to surround the circuit portion. With compared to a semiconductor device which does not employ such a structure of a peripheral region, the semiconductor device of this embodiment can have reduced defects caused by a change over time in shape and characteristics, such as peeling at the end portion of the semiconductor device.

Then, a first insulator 751 is placed to cover the insulating film 723 (see FIG. 4B). In this embodiment, a structure body 726 in which a fibrous body 727 is impregnated with an organic resin 728 is used as the first insulator 751. Further, the case where a first impact attenuating layer 750 is provided on a surface of the structure body 726 is shown as a preferred example. In this embodiment, an aramid resin is used for the first impact attenuating layer 750.

The structure body 726 in which the fibrous body 727 is impregnated with the organic resin 728 is also referred to as a prepreg. A prepreg is formed specifically in such a manner that a fibrous body is impregnated with varnish in which a matrix resin is diluted with an organic solvent, and then the organic solvent is volatilized and the matrix resin is semi-cured. A prepreg has a modulus of elasticity of 13 GPa to 15 GPa, inclusive, and a modulus of rupture of 140 MPa. By using the prepreg which is formed into a thin film, a thin semiconductor device capable of being curved can be manufactured. As typical examples of a fibrous body for a prepreg, a polyvinyl alcohol fiber, a polyester fiber, a polyamide fiber, a polyethylene fiber, an aramid fiber, a polyparaphenylene benzobisoxazole fiber, a glass fiber, and carbon fiber are given. As typical examples of a resin which is used for forming a matrix resin, an epoxy resin, an unsaturated polyester resin, a polyimide resin, and a fluorine resin are given. Note that the prepreg will be described in detail in an embodiment below.

In addition to the structure body 726, the first insulator 751 can include a layer containing a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used for the first insulator 751. Further, the first impact attenuating layer 750 is preferably formed from a high-strength material. Examples of the high-strength material include a polyvinyl alcohol resin, a polyester resin, a polyamide resin, a polyethylene resin, or a polyparaphenylene benzobisoxazole resin, and a glass resin, as well as an aramid resin.

The thickness of the first insulator 751 is 5 μm to 100 μm, inclusive, preferably, 10 μm to 50 μm, inclusive. In this embodiment, the thickness of the first insulator 751 is 32 μm. In the first insulator 751 in this embodiment, the thickness of the structure body 726 and the thickness of the first impact attenuating layer 750 is 20 μm and 12 μm, respectively. With such a structure, a thin semiconductor device capable of being curved can be manufactured.

After the first impact attenuating layer 750 is formed, a first conductive layer 729 is formed on a surface of the first impact attenuating layer 750. An example in which a 100-nm-thick film of a compound of silicon oxide and indium tin oxide is used as the first conductive layer 729 is described. The above first conductive layer 729 is acceptable as long as it has lower resistance than the structure body 726 and the first impact attenuating layer 750. Accordingly, the first conductive layer 729 may be a film or a group of islands arranged with small gaps therebetween. In addition, since the resistance of the first conductive layer 729 is preferably low, the thickness thereof can be 50 nm to 200 nm, inclusive, in consideration of specific resistance or the like of the material which is used. If the first conductive layer 729 has an increased thickness, the resistance can be lowered, which is preferable. The first conductive layer 729 can be formed using, as well as a compound of silicon oxide and indium tin oxide, a material containing an element selected from titanium, molybdenum, tungsten, aluminum, copper, silver, gold, nickel, tin, platinum, palladium, iridium, rhodium, tantalum, cadmium, zinc, iron, silicon, germanium, zirconium, and barium; an alloy material containing any of these above elements as its main component; a compound material containing any of these above elements as its main component; or the like. The first conductive layer 729 can be formed by a sputtering method, a plasma CVD method, a coating method, a printing method, or the like. Alternatively, a plating method such as an electrolytic plating method or an electroless plating method may be used. Note that an insulating film may be formed on the surface of the first conductive layer 729 so that the first conductive layer 729 can be protected.

Figure 5:
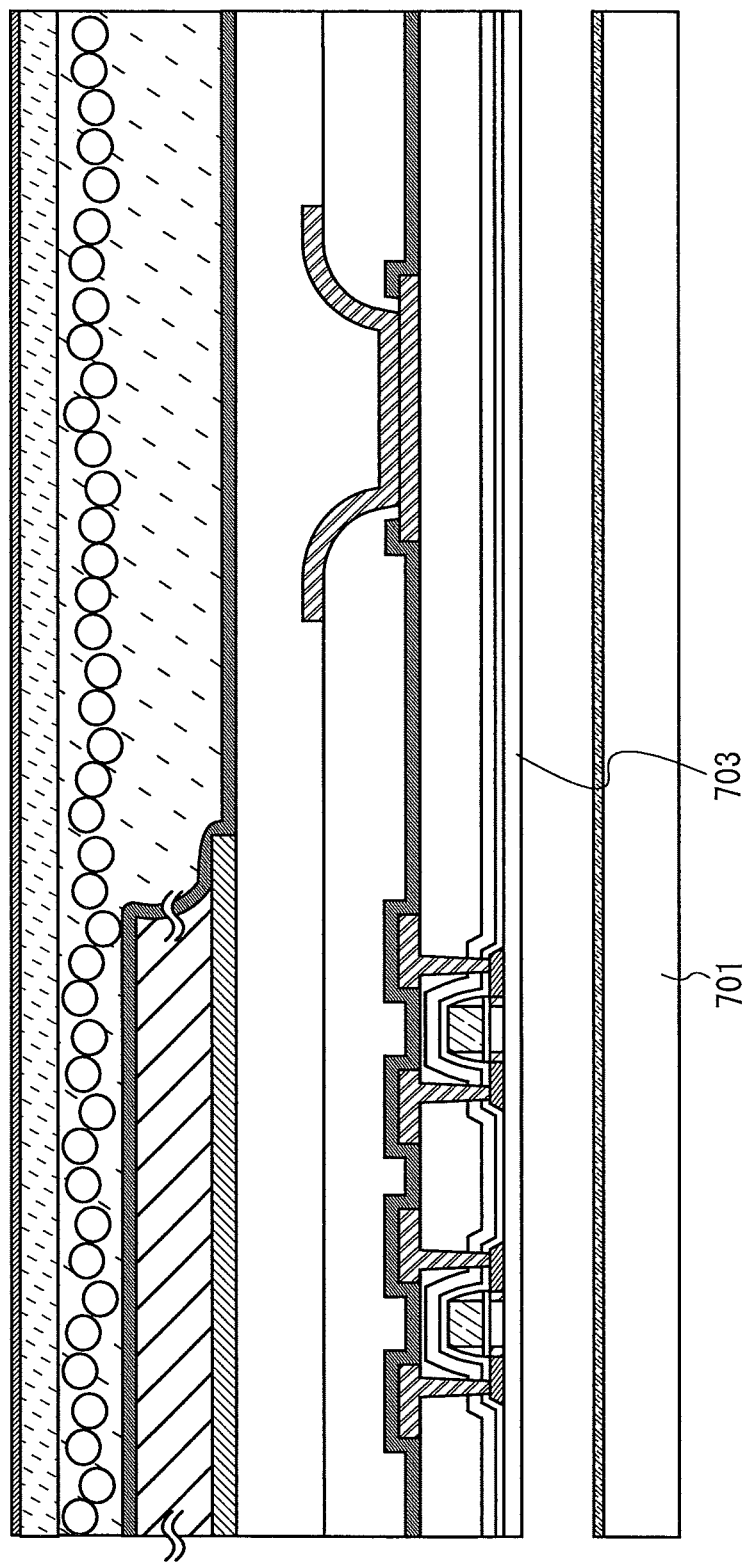
FIG. 5 illustrates a method for manufacturing a semiconductor device according to one embodiment of the present invention.

Next, a layer including the element layer including the thin film transistors 730a and 730b, the conductive film serving as the antenna 720, and the like is separated from the substrate 701 (see FIG. 5). In this step, the separation occurs at the interface between the separation layer 702 and the substrate 701, the interface between the separation layer 702 and the insulating film 703, or in the separation layer 702, whereby the layer including the element layer including the thin film transistors 730a and 730b, the conductive film serving as the antenna 720, and the like is released. If the separation layer 702 unnecessarily remains on the released layer, the separation layer 702 may be removed by etching or the like. As a result, adhesion between the insulating film 703 and a layer to be formed in contact with the insulating film 703 can be heightened.

Note that the separation is preferably performed while wetting a separation surface with water or a solution such as ozone water, so that the elements such as the thin film transistors 730a and 730b can be prevented from being broken due to static electricity and the like. This is because unpaired electrons in the separation layer 702 are paired with ions in the solution.

In addition, cost can be reduced by reusing the substrate 701 after the separation.

Figure 6:
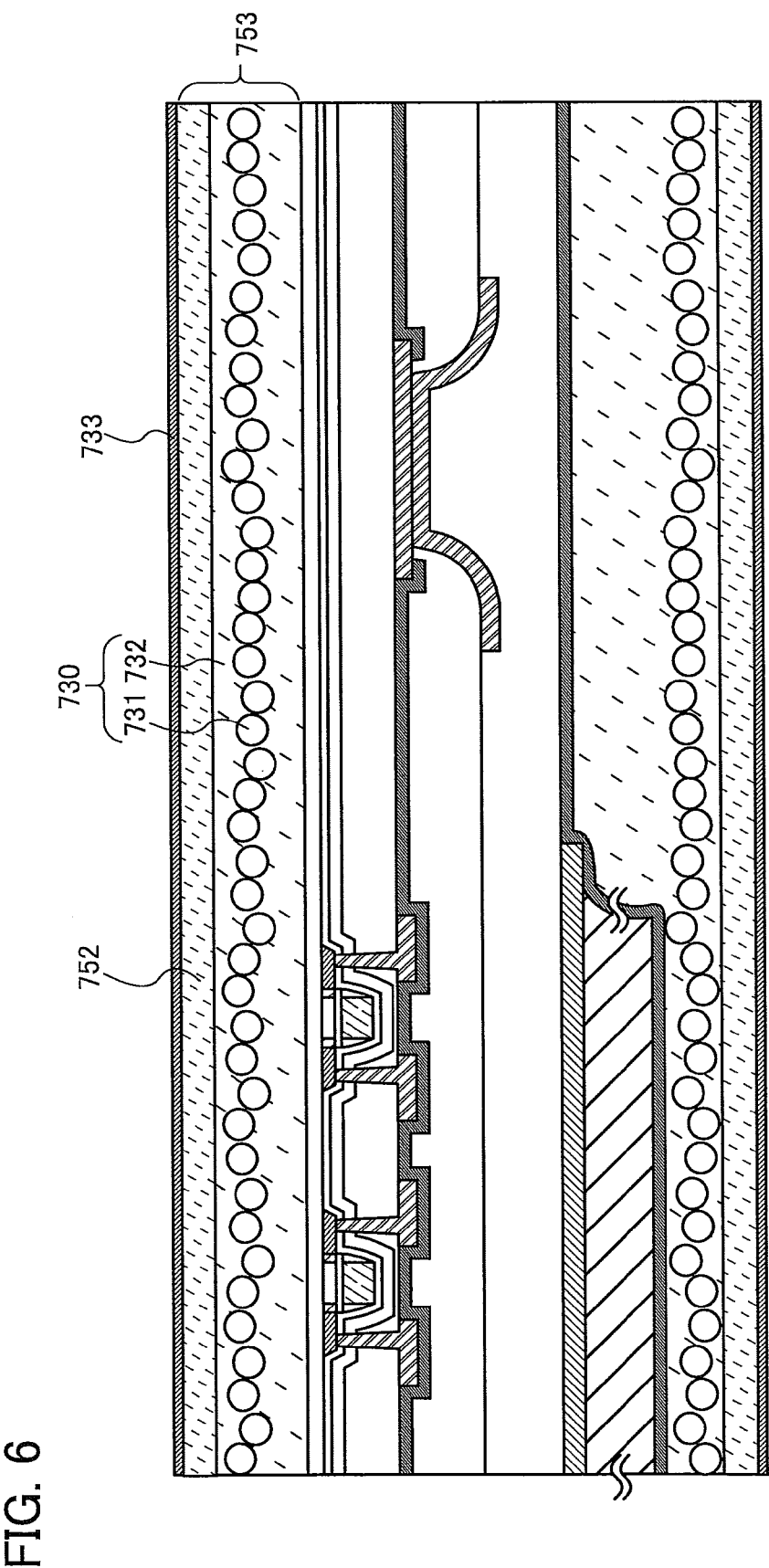
FIG. 6 illustrates a method for manufacturing a semiconductor device according to one embodiment of the present invention.

Next, a second insulator 753 is placed to cover the surface exposed by the separation (see FIG. 6). In this embodiment, the case is described in which, as the second insulator 753, a structure body 730 (a prepreg) in which a fibrous body 731 is impregnated with an organic resin 732 is provided and further, a second impact attenuating layer 752 is provided on a surface of the structure body 730. An aramid resin is used for the second impact attenuating layer 752. It is needless to say that only the structure bodies 726 and 730 can be provided for attachment. In that case, the thickness of the semiconductor device will be 40 μm to 70 μm, preferably, 40 μm to 50 μm. The thickness of the semiconductor device provided with the first and second impact attenuating layers is 70 μm to 90 μm, preferably, 70 μm to 80 μm.

Next, a second conductive layer 733 is formed on the surface of the second insulator 753. The second conductive layer 733 can be formed in a manner similar to the first conductive layer 729. Note that an insulating film may be formed on the surface of the second conductive layer 733 so that the second conductive layer 733 can be protected. Through the above steps, a layered body can be obtained in which the element layer and the antenna are sealed between the first insulator 751 and the second insulator 753, the first conductive layer 729 is formed on the surface of the first insulator 751, and the second conductive layer 733 is formed on the surface of the second insulator 753.

Then, the layered body is cut with a cutting means into separate semiconductor devices. As the cutting means, it is preferable to use a means which melts the first insulator 751 and the second insulator 753 in the cut (it is more preferable to use a means which melts the first conductive layer 729 and the second conductive layer 733). In this embodiment, laser light irradiation is used for the cut.

There is no particular limitation on the conditions, such as wavelength, intensity, and beam size of the laser light used for the above cut. The laser light irradiation may be performed under such conditions that the division can be performed. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, by cutting the semiconductor device into separate semiconductor devices by laser light irradiation, the resistance between the first conductive layer 729 and the second conductive layer 733 is decreased, whereby conduction between the first conductive layer 729 and the second conductive layer 733 is achieved. Accordingly, the step of cutting the semiconductor device and the step of achieving conduction between the first conductive layer 729 and the second conductive layer 733 can be performed at a time.

The value of resistance between the first conductive layer 729 and the second conductive layer 733 should be lower than that of the first insulator 751 and that of the second insulator 753. The value of resistance between the first conductive layer 729 and the second conductive layer 733 may be, for example, 1 GΩ or less, preferably approximately 5 MΩ to 500 MΩ, inclusive, and more preferably approximately 10 MΩ to 200 MΩ, inclusive. Therefore, the semiconductor device may be cut with laser light irradiation or the like so that the above value of resistance can be obtained.

In the above manner, semiconductor devices which are formed by using an insulating substrate can be completed.

This embodiment can be combined as appropriate with any of other embodiments.

(Embodiment 3)

In this embodiment, an example of a cutting step of a semiconductor device is described. Note that the cutting step is described with reference to FIG. 8 and FIG. 9 which illustrates a portion between the semiconductor devices, that is, a peripheral portion.

Figure 8:
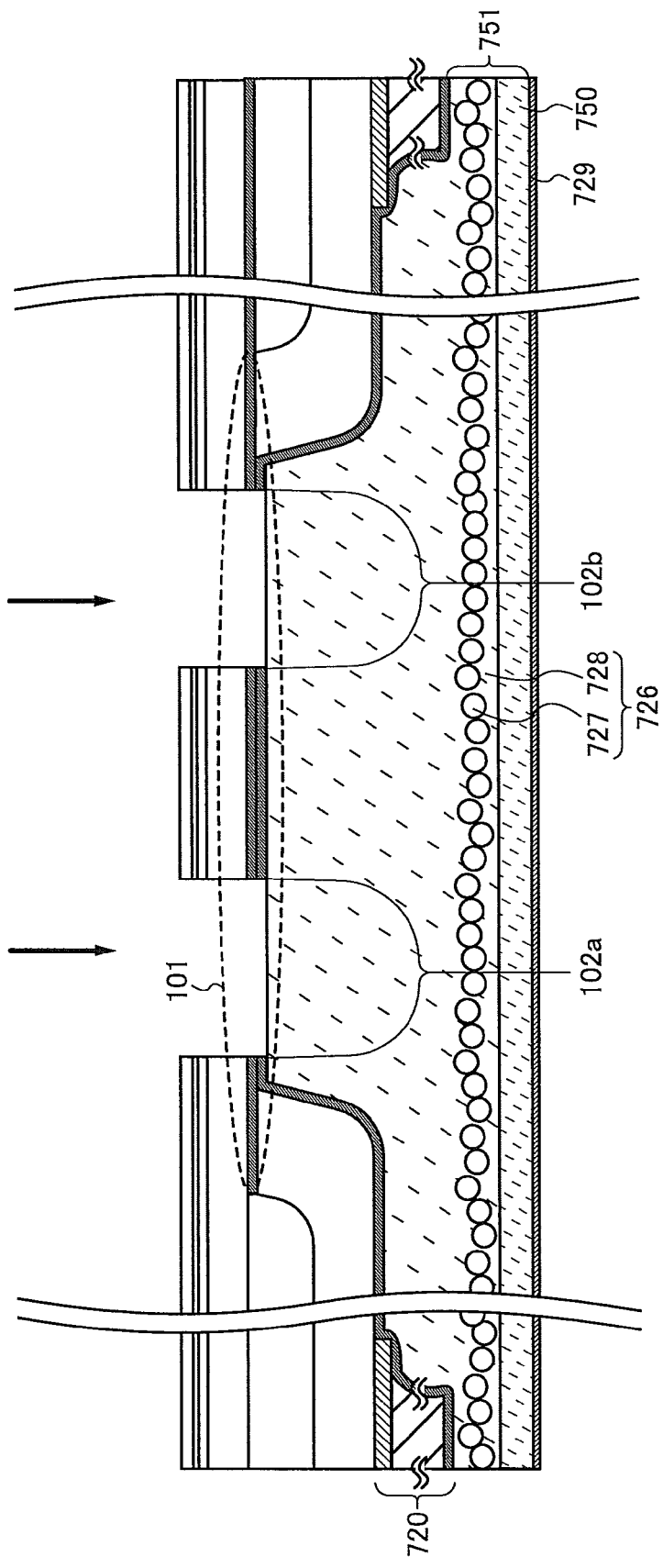
FIG. 8 illustrates a method for manufacturing a semiconductor device according to one embodiment of the present invention.

First, the steps up to the formation of the first conductive layer 729 are performed as described in the above embodiments. After that, as illustrated in FIG. 8, attachment regions 102a and 102b are formed selectively in the peripheral region, that is, in parts of the peripheral region, with a removing means. In selectively removing the peripheral region, in the depth direction, the insulating film and the like are removed to expose the structure body 726. Besides, the attachment regions 102a and 102b are provided to each surround the circuit portion 100 when the semiconductor device is seen from above.

Laser light can be used as such a removing means. That is, the principles of laser ablation can be utilized. There is no particular limitation on conditions, such as wavelength, intensity, and a beam size of the laser light used for the removing means. The laser light irradiation may be performed under such conditions that at least the insulating film, and the like can be removed. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

Note that after the semiconductor device is cut into separate semiconductor devices, the attachment regions 102a and 102b are separately included in the neighboring semiconductor devices. Similarly, the insulating film formation region becomes the insulating film formation regions 101a and 101c which are separately included in the neighboring semiconductor devices after the semiconductor device is cut into separate semiconductor devices (see FIG. 9).

Figure 9:
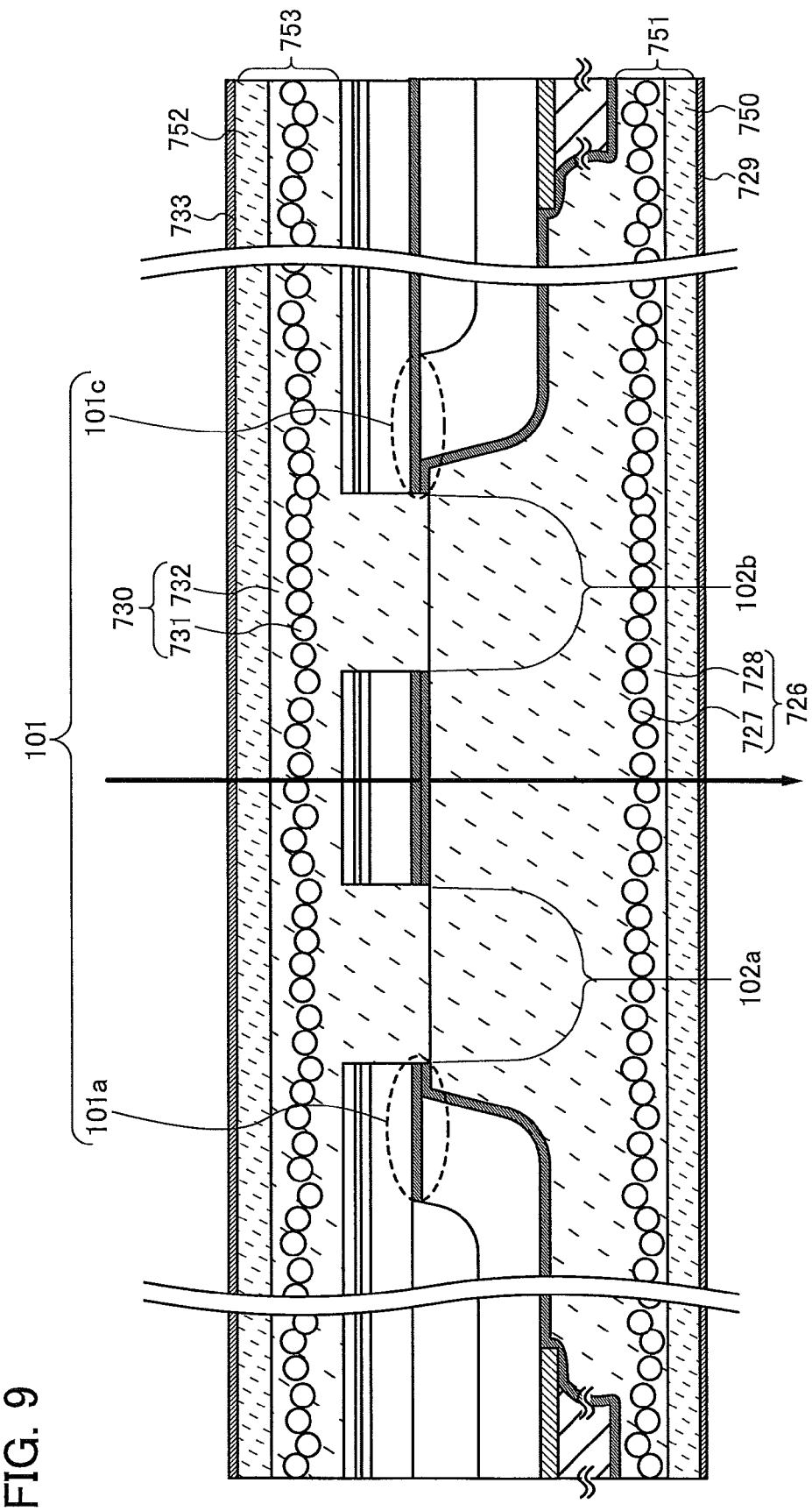
FIG. 9 illustrates a method for manufacturing a semiconductor device according to one embodiment of the present invention.

Then, as illustrated in FIG. 9, the second conductive layer 733 is fainted. In the attachment regions 102a and 102b, the structure bodies 726 and 730 are directly attached. In specific, the organic resin 728 of the structure body 726 and the organic resin 732 of the structure body 730 are in contact and are closely attached to each other. The parts formed from the same materials are closely in contact with each other in such a manner, whereby attachment strength is heightened, which is preferable.

After the attachment is completed, the semiconductor device is cut into separate semiconductor devices. The above embodiments can be referred to for the details of the cutting means.

In the above manner, semiconductor devices with high attachment strength and improved reliability which are formed using an insulating substrate can be completed.

This embodiment can be combined as appropriate with any of other embodiments.

(Embodiment 4)

In this embodiment, as an example of the first and second insulators which are used for sealing a semiconductor device, a structure body in which a fibrous body is impregnated with an organic resin will be described in detail with reference to FIG. 10.

Figure 10:
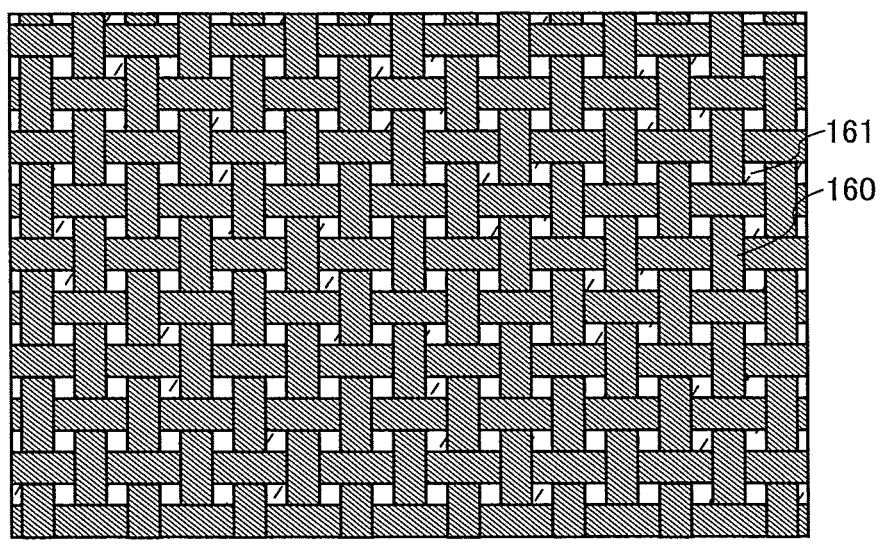
FIG. 10 illustrates a structure body according to one embodiment of the present invention.

A fibrous body 160 is woven from warp yarns spaced at regular intervals and weft yarns spaced at regular intervals (see FIG. 10). Such a fibrous body woven from warp yarns and weft yarns includes regions where neither warp yarns nor weft yarns exist. The fibrous body 160 is more easily impregnated with an organic resin 161, which results in an increase in adhesion between the fibrous body 160 and a semiconductor integrated circuit.

The fibrous body 160 may have a higher density of warp yarns and weft yarns and a smaller region where neither warp yarns nor weft yarns exist.

The structure body in which the fibrous body 160 is impregnated with the organic resin 161 is also referred to as a prepreg. A prepreg is specifically obtained in such a manner that a fibrous body is impregnated with varnish in which a matrix resin is diluted with an organic solvent, and then the organic solvent is dried to be volatilized so that the matrix resin is semi-cured. The thickness of the structure body is 5 μm to 100 μm, inclusive, and more preferably 10 μm to 30 μm, inclusive. By using the structure body with such a thickness, a thin semiconductor device capable of being curved can be manufactured. For example, a prepreg having a modulus of elasticity of 13 GPa to 15 GPa, inclusive and a modulus of rupture of 140 MPa is thinned to be used as the insulators. Further, a thin semiconductor device capable of being curved can be manufactured when impact attenuating layers are additionally provided as in the above embodiments.

As the organic resin 161, it is possible to use a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used as the organic resin 161. With use of the above organic resin, the fibrous body can be firmly bonded to the semiconductor integrated circuit by heat treatment. Note that the higher the glass transition temperature of the organic resin 161 is, the less the organic resin 161 is damaged by local pressing force, which is preferable.

Highly thermally-conductive filler may be dispersed in the organic resin 161 or the yarn bundles of fibers. As the highly thermally-conductive filler, aluminum nitride, boron nitride, silicon nitride, alumina, and the like can be given. Further, as the highly thermally-conductive filler, metal particles such as silver or copper can be given. When the highly thermally-conductive filler is included in the organic resin or the yarn bundles of fibers, heat generated in the semiconductor integrated circuit can be easily released to the outside. Accordingly, thermal storage in the semiconductor device can be suppressed and thus damage to the semiconductor device can be reduced.

The fibrous body 160 is a woven or nonwoven fabric using high-strength fibers of an organic compound or an inorganic compound and provided so as to partly overlap with a part of the semiconductor integrated circuit. A high-strength fiber is specifically a fiber with a high tensile modulus of elasticity or a fiber with a high Young's modulus. As typical examples of a high-strength fiber, there are a polyvinyl alcohol fiber, a polyester fiber, a polyamide fiber, a polyethylene fiber, an aramid fiber, a polyparaphenylene benzobisoxazole fiber, a glass fiber, and a carbon fiber. As a glass fiber, there is a glass fiber using E glass, S glass, D glass, Q glass, or the like. Note that the fibrous body 160 may be formed of one kind of the above high-strength fibers or plural kinds of the above high-strength fibers.

The fibrous body 160 may be a woven fabric that is woven from bundles of fibers (single yarns) (hereinafter referred to as yarn bundles) used for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. The yarn bundle of fibers which has been subjected to fiber opening has a large width and the number of single yarns in the thickness direction can be reduced. In addition, the yarn bundle of fibers has an elliptical shape or a flat shape in cross section. Furthermore, with use of a loosely twisted yarn as the yarn bundle of fibers, the yarn bundle is easily flattened and has an elliptical shape or a flat shape in cross section. By using such a yarn bundle having an elliptical shape or a flat shape in cross section, the thickness of the fibrous body 160 can be reduced. Accordingly, a thin semiconductor device can be manufactured.

By using the above structure body as the insulator sealing the semiconductor device, the resistance of the semiconductor device against external stress can be increased. Furthermore, damages or deterioration in characteristics can be prevented from being generated in a process of applying pressure or the like. Therefore, the semiconductor devices can be manufactured at high yield.

This embodiment can be combined as appropriate with any of other embodiments.

(Embodiment 5)

In this embodiment, an example of a semiconductor device which is intended to have higher reliability will be described. Specifically, examples of a microprocessor and a semiconductor device that has an arithmetic function and can transmit and receive data without contact will be described as examples of the semiconductor device.

Figure 11:
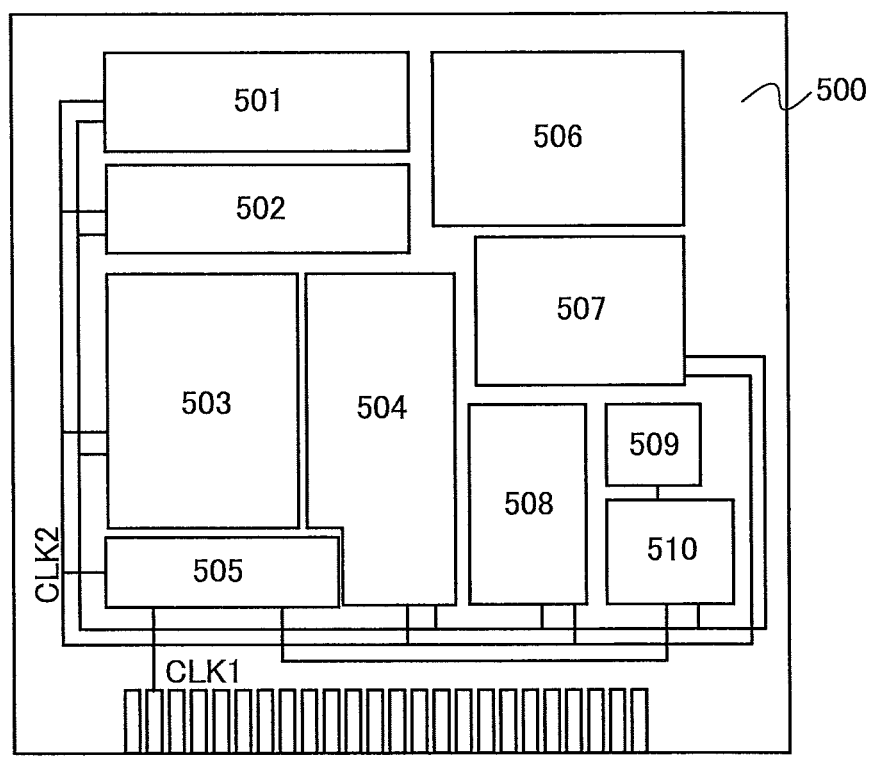
FIG. 11 illustrates an application example of a semiconductor device according to one embodiment of the present invention.

FIG. 11 illustrates an example of a microprocessor 500 as an example of the semiconductor device. The microprocessor 500 is manufactured using the semiconductor device according to the above embodiments. The microprocessor 500 includes an arithmetic logic unit (ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503, decoded, and then input to the ALU controller 502, the interrupt controller 504, the register controller 507, and the timing controller 505. The ALU controller 502, the interrupt controller 504, the register controller 507, and the timing controller 505 conduct variety of controls based on the decoded instruction. Specifically, the ALU controller 502 generates signals for controlling operation of the ALU 501. The interrupt controller 504 is a circuit which processes an interrupt request from an external input/output device or a peripheral circuit based on its priority or a mask state while the microprocessor 500 is executing a program. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to the above various circuits. Note that the microprocessor 500 illustrated in FIG. 11 is only an example having a simplified configuration, and practical microprocessors can have a variety of configurations depending on the application.

Figure 12:
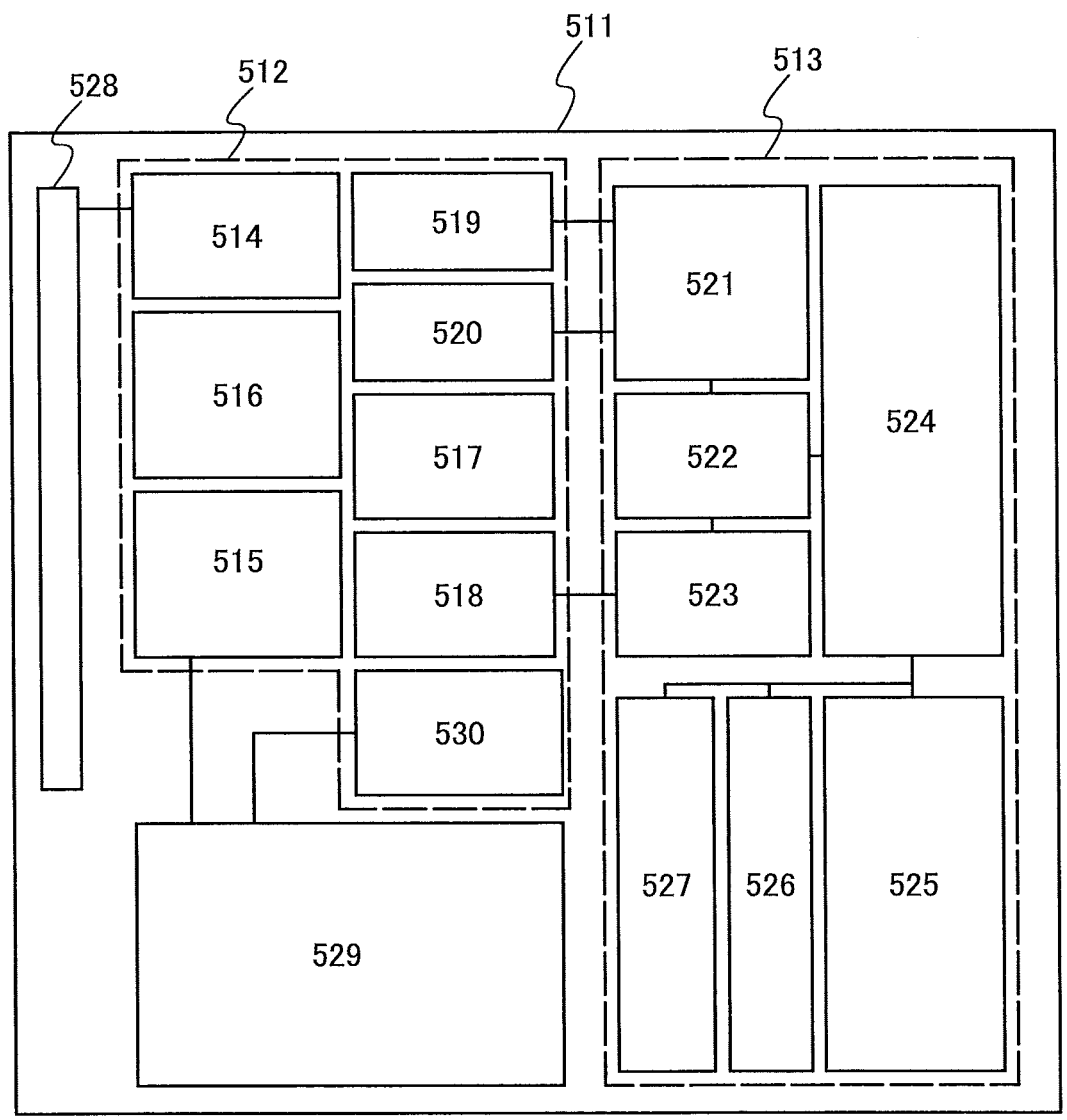
FIG. 12 illustrates an application example of a semiconductor device according to one embodiment of the present invention.

Next, an example of a semiconductor device having an arithmetic function and capable of transmitting and receiving data without contact will be described with reference to FIG. 12. FIG. 12 illustrates an example of a computer (hereinafter referred to as an RFCPU) that operates by transmitting/receiving signals to/from an external device via wireless communication. An RFCPU 511 includes an analog circuit portion 512 and a digital circuit portion 513. The analog circuit portion 512 includes a resonance circuit 514 with a resonance capacitor, a rectifier circuit 515, a constant voltage circuit 516, a reset circuit 517, an oscillator circuit 518, a demodulator circuit 519, a modulator circuit 520, and a power supply control circuit 530. The digital circuit portion 513 includes an RF interface 521, a control register 522, a clock controller 523, an interface 524, a central processing unit 525, a random access memory 526, and a read only memory 527.

The operation of the RFCPU 511 having such a configuration is roughly described below. The resonance circuit 514 generates an induced electromotive force based on a signal received by an antenna 528. The induced electromotive force is stored in a capacitor portion 529 via the rectifier circuit 515. This capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface over which the RFCPU 511 is formed.

The reset circuit 517 generates a signal for resetting and initializing the digital circuit portion 513. For example, the reset circuit 517 generates, as a reset signal, a signal that rises with delay after increase in power supply voltage. The oscillator circuit 518 changes the frequency and duty ratio of a clock signal in response to a control signal generated by the constant voltage circuit 516. The demodulator circuit 519 is formed using a low-pass filter and binarizes for example, changes in amplitude of a received signal of an amplitude shift keying (ASK) system. The modulation circuit 520 changes the amplitude of a transmission signal of the amplitude shift keying (ASK) system and transmits data. The modulation circuit 520 changes the resonance point of the resonance circuit 514, thereby changing the amplitude of a communication signal. The clock controller 523 generates a control signal for changing the frequency and duty ratio of the clock signal in accordance with the power supply voltage or a current consumption of the central processing unit 525. The power supply voltage is monitored by the power supply control circuit 530.

A signal input from the antenna 528 to the RFCPU 511 is demodulated by the demodulator circuit 519 and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of generating an access signal for any of the read only memory 527, the random access memory 526, and the control register 522 based on an address which is requested by the central processing unit 525.

As an arithmetic method of the central processing unit 525, a method may be employed in which the read only memory 527 stores an operating system (OS) and a program is read and executed at the time of starting operation. Alternatively, a method may be employed in which a dedicated arithmetic circuit is formed as an arithmetic circuit and arithmetic processing is performed using hardware. In a method in which both hardware and software are used, part of arithmetic processing can be performed by a dedicated arithmetic circuit, and the other part of the arithmetic processing can be performed by the central processing unit 525 using a program.

Also in the microprocessor of this embodiment, the conductive layer provided on the surface prevents electrostatic breakdown of the semiconductor integrated circuit (malfunction of the circuit, damage to the semiconductor elements, and the like) due to electrostatic discharge. As a result, a semiconductor device in which defects in characteristics due to electrostatic discharge is prevented can be manufactured at high yield.

This embodiment can be combined as appropriate with any of other embodiments.

(Embodiment 6)

In this embodiment, an example of the application of the semiconductor devices shown in the above embodiments will be described. Specifically, an example of the application of a semiconductor device capable of transmitting and receiving data without contact is described with reference to drawings. The semiconductor device capable of transmitting and receiving data without contact is also called an RFID tag, an ID tag, an IC tag, an RF tag, a wireless tag, an electronic tag, or a wireless chip depending on the application.

A top view of an example of a structure of a semiconductor device shown in this embodiment is described with reference to FIG. 13A. A semiconductor device 400 is a device which is formed through division into separate devices according to the above embodiments (the semiconductor device in that state is also called a semiconductor chip). The semiconductor device 400 is provided over a support substrate 406 with an insulating film therebetween. The support substrate 406 is provided with an antenna (also referred to as a booster antenna) 405 which is close to the built-in antenna 720 in a region 407 surrounded by a dashed line.

A circuit portion in the semiconductor device is provided with a memory portion and a logic portion and these portions include a plurality of semiconductor elements such as thin film transistors. In the semiconductor device of this embodiment, not only a field effect transistor other than a thin film transistor but also a memory element and the like including a semiconductor layer can be employed as the semiconductor elements.

Figure 13A:
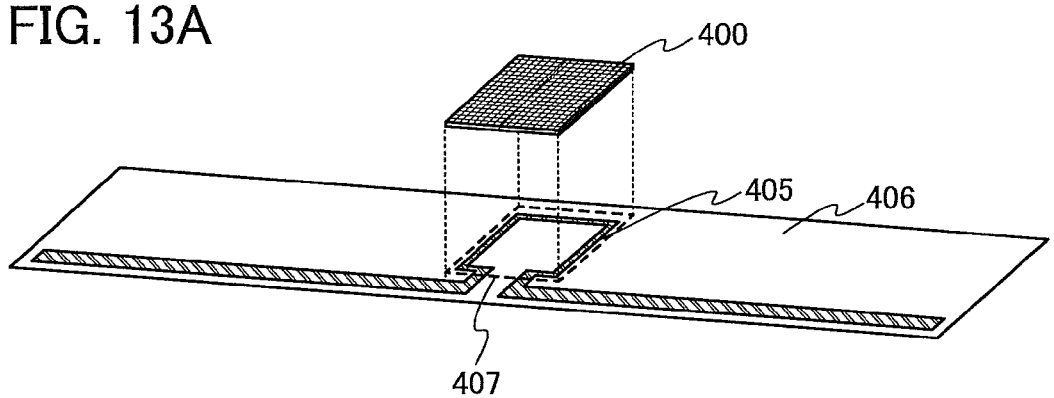
FIGS. 13A to 13C illustrate an application example of a semiconductor device according to one embodiment of the present invention.

In FIG. 13A, the booster antenna 405 is electromagnetically coupled to the built-in antenna 720 (electromagnetic induction) mainly in a loop region 407 surrounded by the dashed line, thereby transmitting and receiving signals and supplying power. The booster antenna 405 can also transmit and receive signals to and from an interrogator and supply power to the interrogator by radiowave in a region other than the region 407 surrounded by the dashed line. A radio wave used as a carrier (a carrier wave) between the interrogator and the semiconductor device preferably has a frequency of about 30 MHz to 5 GHz, inclusive, and for example, may have a frequency band of 950 MHz or 2.45 GHz.

Although the booster antenna 405 has a rectangular loop shape whose number of turns is one in the region 407 surrounded by the dashed line, the present invention is not limited to this structure. The loop portion is not limited to a rectangular shape, but may be a shape with a curve, for example a circular shape. In addition, the number of turns is not limited to one but may be plural.

The semiconductor device of the present invention may adopt an electromagnetic induction method, an electromagnetic coupling method, or a microwave method. In the case of a microwave method, the shapes of the antenna 720 and the booster antenna 405 may be determined as appropriate depending on the wavelength of an electromagnetic wave which is used.

For example, if a microwave method (e.g., UHF band (860 MHz band to 960 MHz band), or 2.45 GHz band) is used as the signal transmission method in the semiconductor device, the length, shape, or the like of the antenna may be determined as appropriate in consideration of the wavelength of an electromagnetic wave used for signal transmission. For example, the antenna can be formed into a linear shape (e.g., a dipole antenna), a flat shape (e.g., a patch antenna or a ribbon shape), or the like. Further, the antenna is not limited to having a linear shape, and the antenna may have a curved shape, a serpentine curved shape, or a shape combining them in consideration of the wavelength of the electromagnetic wave.

Figure 14:
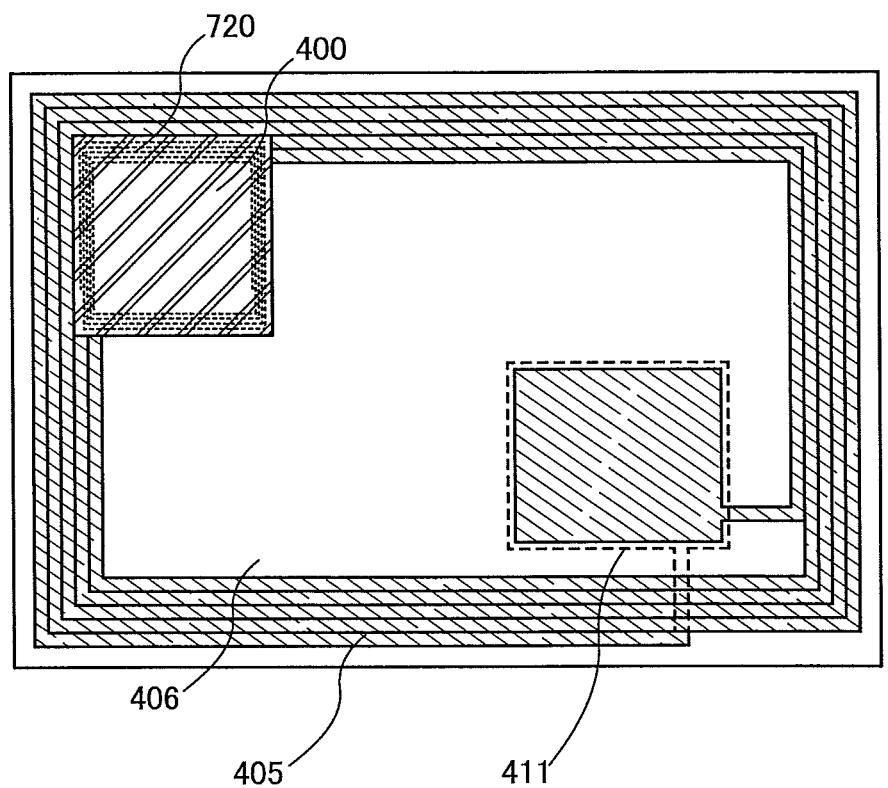
FIG. 14 illustrates an application example of a semiconductor device according to one embodiment of the present invention.

FIG. 14 illustrates an example in which the built-in antenna 720 and the booster antenna 405 each have a coil shape and an electromagnetic induction method or an electromagnetic coupling method is employed.

In FIG. 14, the coil-shaped antenna 405 is provided as the booster antenna over the support substrate 406, and the semiconductor device 400 including the coil-shaped built-in antenna 720 is provided over the support substrate 406. Note that a capacitor 411 is formed by being interposed between the booster antenna 405 and the support substrate 406.

Figure 13B:
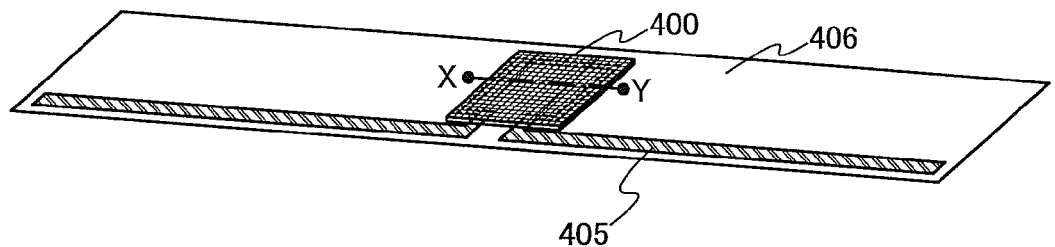
Figure 13C:
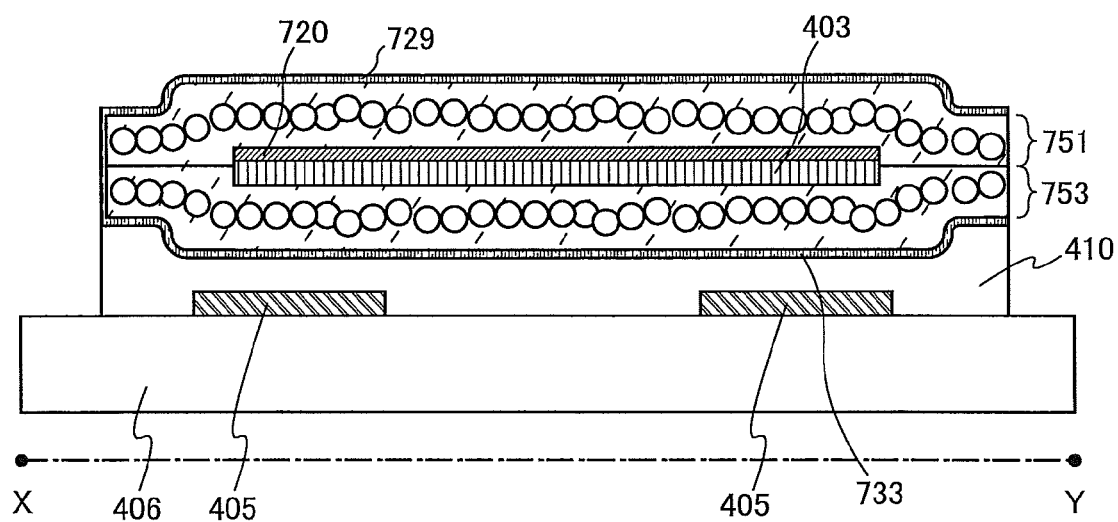

Next, the structures and arrangements of the semiconductor device 400 and the booster antenna 405 will be described. FIG. 13B is a perspective view in which the semiconductor device 400 in FIG. 13A and the booster antenna 405 formed over the support substrate 406 are stacked. FIG. 13C is a cross-sectional view taken along dashed line X-Y of FIG. 13B.

As the semiconductor device 400 illustrated in FIG. 13C, the semiconductor device described in the above embodiments can be used. Here, a chip obtained by cutting the semiconductor device into separate devices is used. Accordingly, the semiconductor device 400 is also referred to as a semiconductor chip.

A circuit portion 403 included in the semiconductor device illustrated in FIG. 13C is held between the first insulator 751 and the second insulator 753, and the side surfaces of the circuit portion 403 are also sealed. As for the structures of the first insulator 751 and the second insulator 753, the above embodiments are to be referred to. Further, laser light is used as the cutting means, whereby the first and second insulators melt to seal the side surfaces of the circuit portion 403.

In the semiconductor device of this embodiment, the antenna and the circuit portion electrically connected to the antenna are sandwiched between the first insulator and the second insulator and the first conductive layer 729 and the second conductive layer 733 are provided on the outer surfaces of the first insulator and the second insulator, respectively. The first conductive layer 729 and the second conductive layer 733 have functions of transmitting electromagnetic waves which are to be transmitted and received by the built-in antenna 720 and shielding the circuit portion in the semiconductor device from application of static electricity from the outside.

In FIG. 13C, the circuit portion 403 is nearer to the booster antenna 405 than the built-in antenna 720 is to the booster antenna 405. In this state, transmitting and receiving signals and supplying power by electromagnetic coupling (electromagnetic induction) are easily conducted. However, the built-in antenna 720 may be nearer to the booster antenna 405 than the circuit portion 403 is to the booster antenna 405. Either structure can be employed in accordance with a distance with which electromagnetic coupling (electromagnetic induction) is easily performed, which depends on a material of the antenna. Further, the circuit portion 403 and the built-in antenna 720 may be firmly bonded to the first insulator 751 and the second insulator 753 directly, or firmly bonded thereto with an adhesive.

Note that in FIG. 13C, the semiconductor device 400 is provided over an insulating film 410 formed over the support substrate 406 and the booster antenna 405; however, the present invention is not limited thereto. For example, if the resistance of the conductive layer is sufficiently high, the first conductive layer 729 or the second conductive layer 733 may be in contact with the booster antenna 405.

Figure 15:
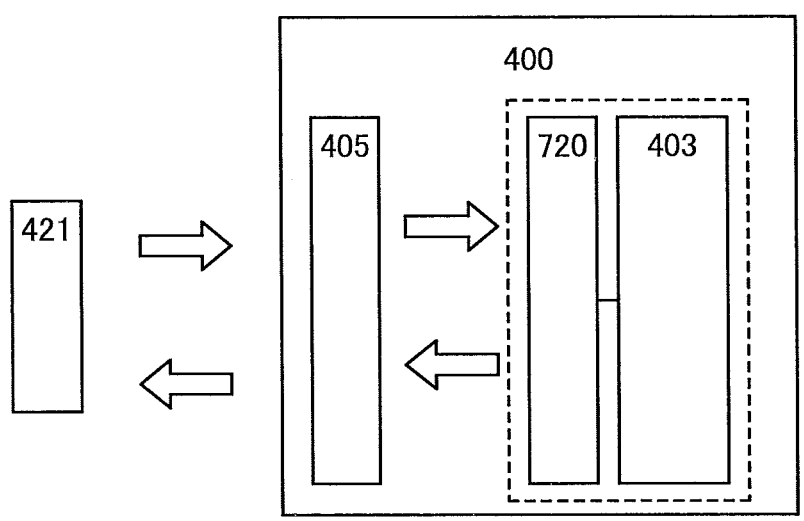
FIG. 15 illustrates an application example of a semiconductor device according to one embodiment of the present invention.

Next, operation of the semiconductor device of this embodiment will be described. FIG. 15 is an example of a block diagram illustrating the configuration of the semiconductor device of this embodiment. The semiconductor device 400 illustrated in FIG. 15 includes the booster antenna 405, the booster circuit portion 403, and the built-in chip antenna 720. When an electromagnetic wave is transmitted from an interrogator 421, the booster antenna 405 receives the electromagnetic wave to generate alternate current, whereby a magnetic field is generated around the booster antenna 405. Then, a loop portion of the booster antenna 405 is electromagnetically coupled to the built-in antenna 720 which has a loop shape, so that induced electromotive force is generated in the built-in antenna 720. The circuit portion 403 receives a signal or power from the interrogator 421 using the induced electromotive force. On the other hand, current is made to flow through the built-in antenna 720 and induced electromotive force is generated in the booster antenna 405 in accordance with a signal generated in the circuit portion 403, whereby the signal can be transmitted to the interrogator 421 as a reflected wave of the radio wave transmitted from the interrogator 421.

Note that the booster antenna 405 has a loop portion that is mainly electromagnetically coupled to the built-in antenna 720 and a portion that mainly receives electromagnetic waves from the interrogator 421. The shape of the portion of the booster antenna 405 which mainly receives radio waves from the interrogator 421 is not particularly limited as long as the booster antenna 405 can receive radio waves. For example, the shape of a dipole antenna, a folded dipole antenna, a slot antenna, a meander line antenna, a microstrip antenna, or the like may be used.

Although FIGS. 13A to 13C illustrate the structure of the semiconductor device having only one antenna, the present invention is not limited to this structure. The semiconductor device may have two antennas: one for receiving power and the other for receiving signals. When two antennas are included, a frequency of radio waves for supplying power and a frequency of radio waves for transmitting signals can be different.

In the semiconductor device of this embodiment, the built-in chip antenna is used and signals or power can be transmitted and received to and from the booster antenna and the built-in chip antenna without contact. Therefore, unlike the case where an external antenna such as a booster antenna is connected to the circuit portion, disconnection between the circuit portion and the antenna by external stress is not likely to occur, which reduces initial defects in the connection. In addition, the booster antenna is used in this embodiment. Accordingly, unlike the case where only the built-in chip antenna is used, the area of the circuit portion is not likely to limit the size or shape of the built-in chip antenna. Therefore, the frequency band of radio waves which can be received is not limited, and the communication distance can be increased.

In the semiconductor device of this embodiment, the conductive layer on the surface can prevent electrostatic breakdown of the circuit portion (malfunction of the circuit, damage to the semiconductor elements, and the like) due to electrostatic discharge. As a result, a semiconductor device in which defects in characteristics due to electrostatic discharge is prevented can be manufactured at high yield. Since the semiconductor device of this embodiment has high reliability against external force and static electricity, it can be used under a wider variety of conditions; therefore, the application range of the semiconductor device can be increased.

This embodiment can be combined as appropriate with any of other embodiments.

(Embodiment 7)

In this embodiment, an example of the application of the semiconductor devices capable of transmitting and receiving data without contact, which are formed according to the above embodiments, will be described below with reference to FIGS. 16A to 16C. The semiconductor device capable of transmitting and receiving data without contact is also called an RFID tag, an ID tag, an IC tag, an IC chip, an RF tag, a wireless tag, an electronic tag, or a wireless chip depending on the application.

Figure 16A:
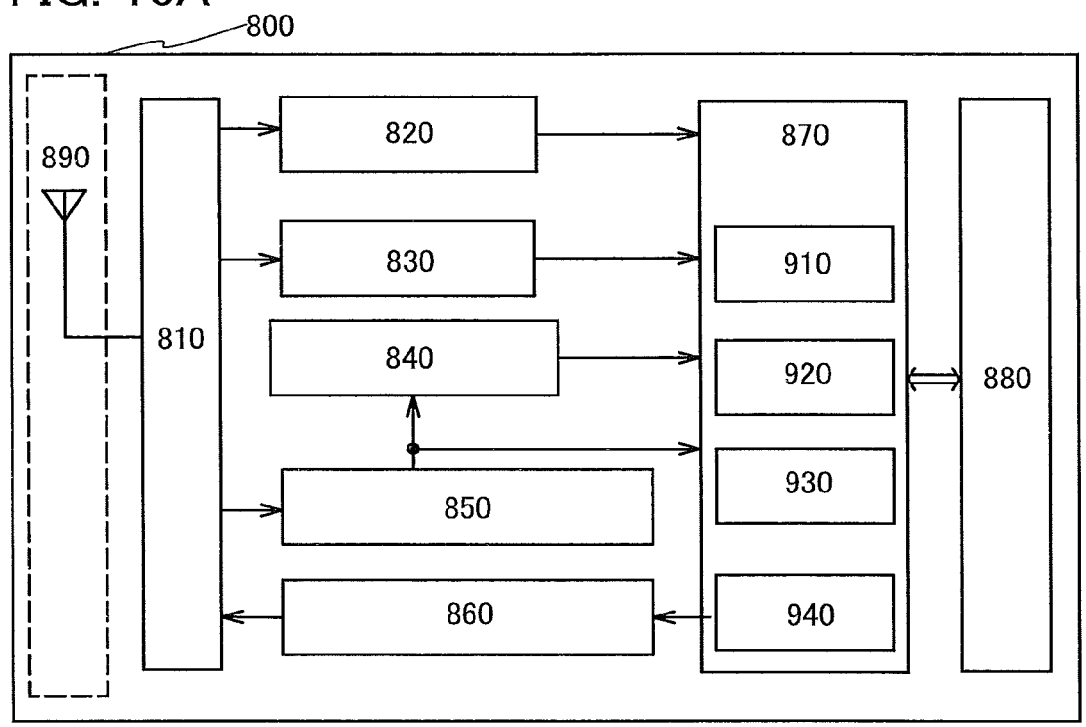
FIGS. 16A to 16C illustrate application examples of a semiconductor device according to one embodiment of the present invention.
Figure 16B:
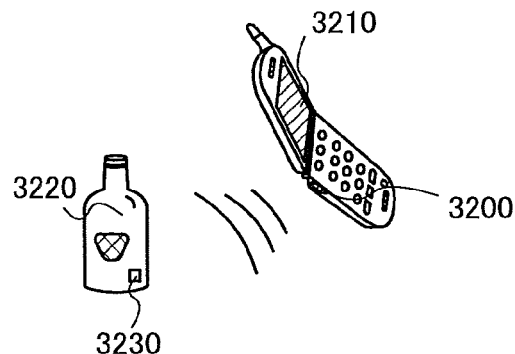
Figure 16C:
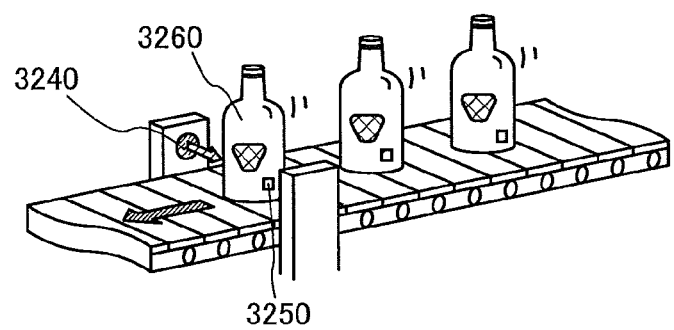
Figure 17A:
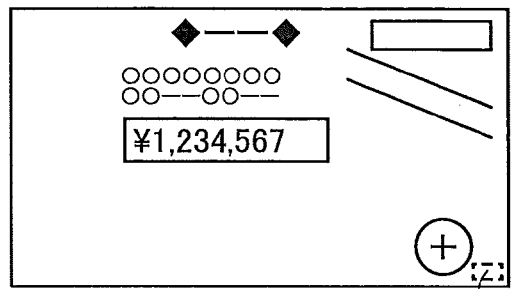
FIGS. 17A to 17G illustrate application examples of a semiconductor device according to one embodiment of the present invention.
Figure 17B:
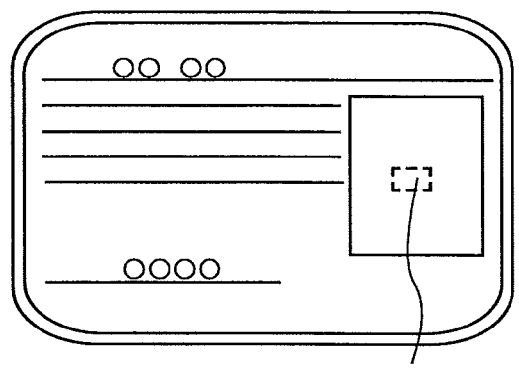
Figure 17C:
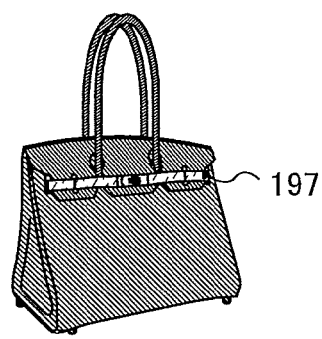
Figure 17D:
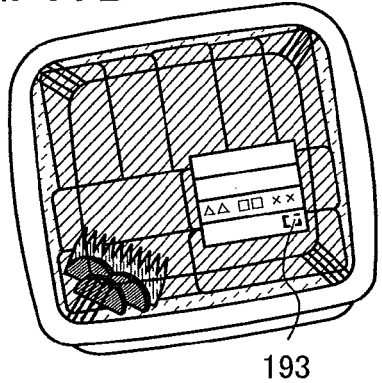
Figure 17E:
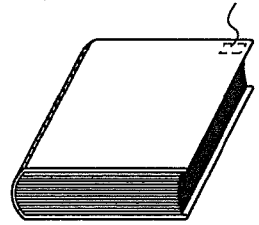
Figure 17F:
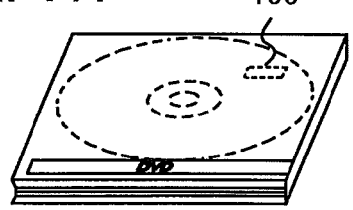
Figure 17G:
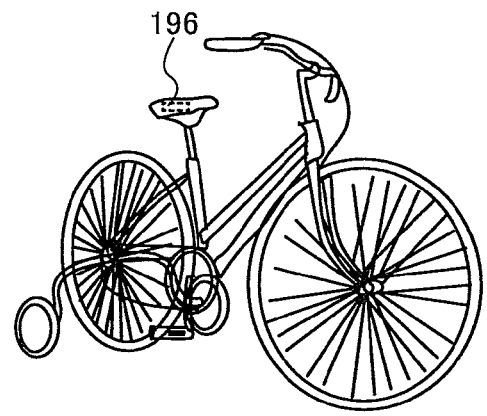

A semiconductor device 800 has a function of exchanging data without contact, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (see FIG. 16A). The high-frequency circuit 810 receives a signal from the antenna 890 and outputs a signal received from the data demodulation circuit 860 through the antenna 890. The power supply circuit 820 generates a power supply potential from the received signal. The reset circuit 830 generates a reset signal. The clock generation circuit 840 generates various clock signals based on the signal input from the antenna 890. The data demodulation circuit 850 demodulates the received signal and outputs the signal to the control circuit 870. The data modulation circuit 860 modulates a signal received from the control circuit 870. The control circuit 870 includes, for example, a code extracting circuit 910, a code determining circuit 920, a CRC determining circuit 930, and an output unit circuit 940. Note that the code extracting circuit 910 extracts a plurality of codes included in an instruction transmitted to the control circuit 870. The code determining circuit 920 compares the extracted code with a reference code to determine the content of the instruction. The CRC determining circuit 930 detects a transmission error and the like based on the determined code.

Next, an example of operation of the above semiconductor device is described. First, a radio signal is received by the antenna 890. The radio signal is transmitted to the power supply circuit 820 via the high frequency circuit 810, thereby generating a high power supply potential (hereinafter referred to as a VDD). The VDD is supplied to circuits of the semiconductor device 800. A signal transmitted to the data demodulation circuit 850 via the high frequency circuit 810 is demodulated (hereinafter referred to as a demodulated signal). Further, a signal and a demodulated signal which pass through the reset circuit 830 and the clock generation circuit 840 via the high frequency circuit 810 are transmitted to the control circuit 870. The signals transmitted to the control circuit 870 are decoded by the code extracting circuit 910, the code determining circuit 920, the CRC determining circuit 930, and the like. Then, the data of the semiconductor device 800 stored in the memory circuit 880 is output based on the decoded signals. The output data of the semiconductor device 800 is encoded via the output unit circuit 940. In addition, the encoded data of the semiconductor device 800 passes through the data modulation circuit 860 to be transmitted as a radio signal via the antenna 890. Note that a low power supply potential (hereinafter referred to as a VSS) is common among a plurality of circuits included in the semiconductor device 800, and the VSS can be set to GND.

In this manner, the data of the semiconductor device 800 can be read by transmitting a signal from a communication device to the semiconductor device 800 and receiving a signal from the semiconductor device 800 by the communication device.

The semiconductor device 800 may have a structure in which no power supply (a battery) is built-in but electromagnetic waves are used to supply power supply voltage to each circuit, or a structure in which a power supply (a battery) is built-in and both electromagnetic waves and the power supply (the battery) are used to supply power supply voltage to each circuit.

Next, an example of the application of a semiconductor device capable of transmitting and receiving data without contact is described. A communication device 3200 is provided on the side of a portable terminal including a display portion 3210, and a semiconductor device 3230 is provided on the side of an object 3220 (see FIG. 16B). When the communication device 3200 is put close to the semiconductor device 3230 on the object 3220, information on the object 3220, such as the raw material or the source of the product, inspection result in each production step, history of the distribution process, and explanation of the product is displayed on the display portion 3210. Further, when a product 3260 is transferred by a conveyer belt, the product 3260 can be inspected using a communication device 3240 and a semiconductor device 3250 provided on the product 3260 (see FIG. 16C). The use of the semiconductor device for such a system allows information to be easily obtained, thereby achieving a system with high function and high added-value.

As described above, the application range of the highly reliable semiconductor device of this embodiment is so wide that the semiconductor device can be used in electronic devices in a variety of fields.

This embodiment can be combined as appropriate with any of other embodiments.

(Embodiment 8)

According to the above embodiments, a semiconductor device can be formed which functions as a chip having a processor circuit (hereinafter, also referred to as a processor chip, a wireless chip, a wireless processor, a wireless memory, or a wireless tag). The semiconductor device of this embodiment can be applied to a wide variety of products in which the information on the product such as the history is revealed without contact and utilized in production, management, and the like. For example, the semiconductor device can be incorporated in bills, coins, securities, certificates, bearer bonds, packaging containers, books, recording media, personal belongings, vehicles, groceries, garments, health products, household goods, medicines, and electronic devices. Examples of such products will be described with reference to FIGS. 17A to 17G.

Bills and coins are money that circulates in the market, and include one that can be used in the same way as money in a specific area (cash voucher), a commemorative coin, and the like. The securities refer to checks, certificates, promissory notes, and the like, and can be provided with a chip 190 including a processor circuit (see FIG. 17A). The certificates refer to driver's licenses, certificates of residence, and the like, and can be provided with a chip 191 including a processor circuit (see FIG. 17B). The personal belongings refer to bags, a pair of glasses, and the like, and can be provided with a chip 197 including a processor circuit (see FIG. 17C). Bearer bonds refer to stamps, rice coupons, various merchandise coupons, and the like. The packaging containers refer to wrapping paper for a lunch box or the like, plastic bottles, and the like and can be provided with a chip 193 including a processor circuit (see FIG. 17D). The books refer to hardbacks, paperbacks, and the like, and can be provided with a chip 194 including a processor circuit (see FIG. 17E). The recording media refer to DVD software, video tapes, and the like, and can be provided with a chip 195 including a processor circuit (see FIG. 17F). The vehicles refer to wheeled vehicles such as bicycles, ships, and the like, and can be provided with a chip 196 including a processor circuit (see FIG. 17G). The groceries refer to foods, beverages, and the like. The garments refer to clothes, shoes, and the like. The health products refer to medical apparatuses, health appliances, and the like. The household goods refer to furniture, lighting apparatuses, and the like. The medicines refer to drugs, agricultural chemicals, and the like. The electronic devices refer to liquid crystal display devices, EL display devices, television sets (a television receiver and a thin television receiver), cellular phones, and the like.

Such a semiconductor device is provided by being attached to the surface of a product or being embedded in a product. For example, in the case of a book, the semiconductor device may be embedded in the paper; and in the case of a package made of an organic resin, the semiconductor device may be embedded in the organic resin.

By thus providing the semiconductor device in the packaging containers, the recording media, the personal belongings, the groceries, the garments, the household goods, the electronic devices, and the like, the efficiency of an inspection system, a system used in a rental shop, and the like can be improved. In addition, by providing the semiconductor device in the vehicles, forgery or theft can be prevented. Moreover, when the semiconductor device is implanted into creatures such as animals, each creature can be identified easily. For example, by implanting or attaching the semiconductor device provided with a sensor in or to a creature such as livestock, its health condition such as a current body temperature as well as its year of birth, sex, breed, or the like can be easily recognized.

This embodiment can be combined as appropriate with any of other embodiments.

Example 1

This example shows the results of verification of the effect of the manufacturing method that is one embodiment of the present invention.

A sample was formed in the following manner: a first conductive layer, a first impact attenuating layer, a first insulator, an antenna, a circuit portion including a thin film transistor and the like, a second insulator, a second impact attenuating layer, and a second conductive layer were stacked to form a layered structure, and the layered structure was cut by laser light irradiation into separate semiconductor devices. As a comparative example, another sample was prepared in the following manner: a first conductive layer, a first impact attenuating layer, a first insulator, an antenna, the same circuit portion as that in the above sample, a second insulator, a second impact attenuating layer, and a second conductive layer were stacked to form a layered structure, and the layered structure was cut with a knife into separate semiconductor devices.

In the above samples, a prepreg (with a film thickness of 20 µm) that is a structure body in which a fibrous body (glass fiber) is impregnated with an organic resin (a brominated epoxy resin) was used for each of the first insulator and the second insulator. As the first conductive layer and the second conductive layer, a titanium film (with a thickness of 10 nm) was formed by a sputtering method. An aramid resin film (with a thickness of 12 µm) was used for each of the first impact attenuating layer and the second impact attenuating layer. Note that a silicon nitride film was formed as a protective layer over the antenna, and an acrylic resin film (with a thickness of 10 µm) was formed as an adhesive between the first impact attenuating layer and the circuit portion.

Figure 18:
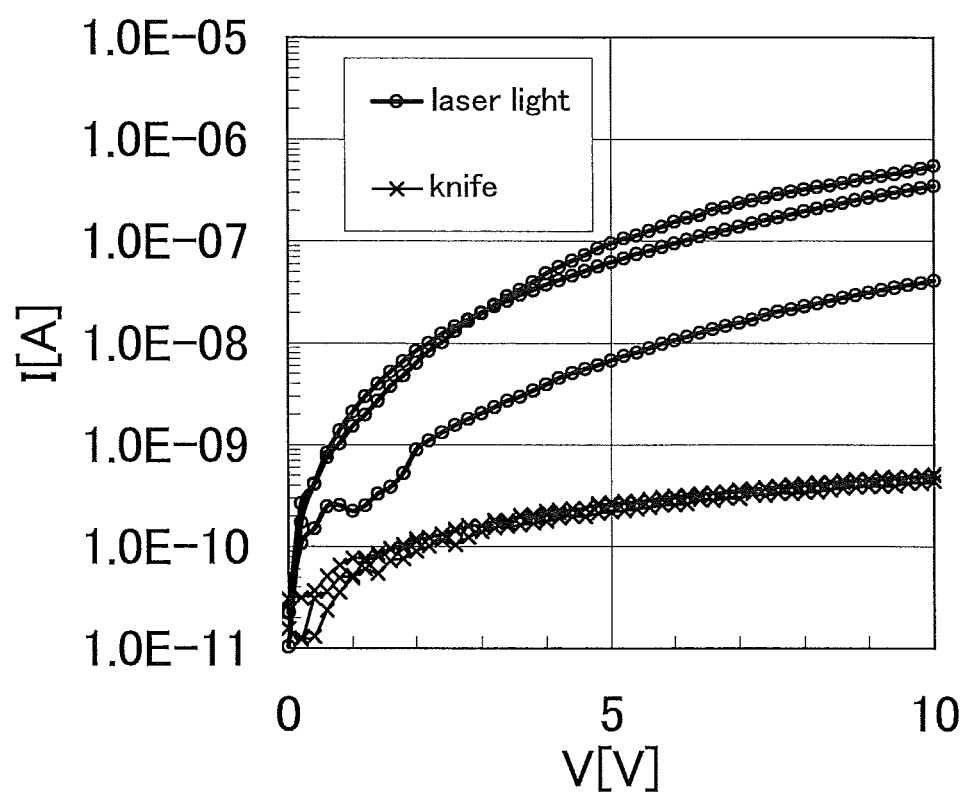
FIG. 18 is a graph of a relationship between application voltage and current between a first and second conductive layers after cut.

Voltage was applied to the above samples (three samples and three comparative samples), and then the values of current flowing between the first conductive layer and the second conductive layer were measured. FIG. 18 shows the relationship between applied voltage and current.

FIG. 18 shows that the current value is larger (the resistance value is smaller) in the samples cut by the laser light irradiation than in the samples cut with the knife. Specifically, in the samples cut with the knife, the resistance between the first conductive layer and the second conductive layer was approximately 20 GΩ (at 10 V). On the other hand, in the samples cut by the laser light irradiation, the resistance between the first conductive layer and the second conductive layer was approximately 10 MΩ to 200 MΩ, inclusive (at 10 V).

Thus, it was found that the resistance between the first conductive layer and the second conductive layer was decreased when the semiconductor device was cut by laser light irradiation. This may be because, in the case of cutting the semiconductor device by laser light irradiation, materials of the conductive layers are dispersed in the insulators when the insulators are melted, whereby electrical conduction of the conductive layers is achieved, whereas in the case of cutting the semiconductor devices with a knife, no current path is formed by the materials of the conductive layers. Note that if the value of resistance between the first conductive layer and the second conductive layer is approximately 1 GΩ or lower (at 10 V), static electricity can be sufficiently dissipated; therefore, measures against static electricity may be taken depending on that value.

Note that this embodiment can be implemented in appropriate combination with the structures or manufacturing methods described in the other embodiments of this specification.

This application is based on Japanese Patent Application serial no. 2008-240812 filed with Japan Patent Office on Sep. 19, 2008, the entire contents of which are hereby incorporated by reference.

What is claimed is:

1. A semiconductor device comprising:
   a first conductive layer;
   a first insulating film over the first conductive layer;
   a circuit portion over the first insulating film, the circuit portion comprising a transistor;
   a second insulating film over the circuit portion; and
   a second conductive layer over the second insulating film,
   wherein the first insulating film is in contact with the second insulating film at a periphery of the circuit portion,
   wherein each of the first conductive layer and the second conductive layer comprises one of titanium and a compound of silicon oxide and indium tin oxide, and
   wherein the first conductive layer is electrically connected to the second conductive layer at side surfaces of the first insulating film and the second insulating film.

2. The semiconductor device according to claim 1, further comprising an antenna over the circuit portion.

3. The semiconductor device according to claim 1,
   wherein the transistor is a thin film transistor.

4. A semiconductor device comprising:
   a first conductive layer;
   a first insulating film over the first conductive layer;
   a circuit portion over the first insulating film, the circuit portion comprising a transistor;
   a third insulating film over the circuit portion;
   a fourth insulating film over the third insulating film;
   a second insulating film over the fourth insulating film; and
   a second conductive layer over the second insulating film,
   wherein the first insulating film is in contact with the second insulating film at a periphery of the circuit portion,
   wherein each of the first conductive layer and the second conductive layer comprises one of titanium and a compound of silicon oxide and indium tin oxide,
   wherein the third insulating film is in contact with the fourth insulating film at the periphery of the circuit portion, and
   wherein the first conductive layer is electrically connected to the second conductive layer at side surfaces of the first insulating film and the second insulating film.

5. The semiconductor device according to claim 4, further comprising an antenna over the circuit portion.

6. The semiconductor device according to claim 4,
   wherein the transistor is a thin film transistor.

7. A semiconductor device comprising:
   a first conductive layer;
   a first insulating film over the first conductive layer;
   a circuit portion over the first insulating film, the circuit portion comprising a transistor;
   a third insulating film over the circuit portion;
   a fourth insulating film over the third insulating film;
   a second insulating film over the fourth insulating film; and
   a second conductive layer over the second insulating film,
   wherein the first insulating film is in contact with the second insulating film at a periphery of the circuit portion, wherein each of the first conductive layer and the second conductive layer comprises one of titanium and a compound of silicon oxide and indium tin oxide, wherein the third insulating film is in contact with the fourth insulating film at the periphery of the circuit portion, wherein the circuit portion overlaps with the first conductive layer and the second conductive layer, wherein the first conductive layer is electrically connected to the second conductive layer at side surfaces of the first insulating film and the second insulating film.

8. The semiconductor device according to claim 7, further comprising an antenna over the circuit portion.

9. The semiconductor device according to claim 7, wherein the transistor is a thin film transistor.

* * * * *